US012813336B2

(12) United States Patent
Do

(10) Patent No.: US 12,813,336 B2
(45) Date of Patent: Nov. 24, 2026

(54) ULTRA-THIN FIN LED ELECTRODE ASSEMBLY, MANUFACTURING METHOD THEREOF AND LIGHT SOURCE COMPRISING THE SAME

(71) Applicant: Kookmin University Industry Academy Cooperation Foundation, Seoul (KR)

(72) Inventor: Young Rag Do, Seoul (KR)

(73) Assignee: KOOKMIN UNIVERSITY INDUSTRY ACADEMY COOPERATION FOUNDATION, Seoul (KR)

(*) Notice: Subject to any disclaimer, the term of this patent is extended or adjusted under 35 U.S.C. 154(b) by 577 days.

(21) Appl. No.: 18/221,213

(22) Filed: Jul. 12, 2023

(65) Prior Publication Data

US 2024/0021588 A1 Jan. 18, 2024

(30) Foreign Application Priority Data

Jul. 13, 2022 (KR) ........................ 10-2022-0086122

(51) Int. Cl.

*H10W 90/00* (2026.01)
*H10H 20/819* (2025.01)
*H10H 20/857* (2025.01)

(52) U.S. Cl.

CPC .......... *H10W 90/00* (2026.01); *H10H 20/819* (2025.01); *H10H 20/857* (2025.01)

(58) Field of Classification Search

CPC ... H10W 90/10; H10W 90/15; H10W 90/155; H10H 20/032; H10H 20/818; H10H 20/819; H10H 20/831; H10H 20/8316; H10H 20/857; H10H 20/0364; H10H 20/0137; H01L 2224/95085

See application file for complete search history.

(56) References Cited

U.S. PATENT DOCUMENTS

| | | | | |
|---|---|---|---|---|
| 2008/0272391 | A1* | 11/2008 | Kapur | H10H 20/826 438/22 |
| 2016/0211245 | A1* | 7/2016 | Do | H10W 90/00 |
| 2021/0280740 | A1* | 9/2021 | Akatsuka | H10H 20/813 |

(Continued)

FOREIGN PATENT DOCUMENTS

| | | |
|---|---|---|
| KR | 20140104717 A | 8/2014 |
| KR | 101436123 B1 | 11/2014 |

(Continued)

*Primary Examiner* — William B Partridge
*Assistant Examiner* — David Paul Sedorook
(74) *Attorney, Agent, or Firm* — Harness, Dickey & Pierce, 1P.L.C.

(57) ABSTRACT

The present invention relates to an LED electrode assembly, and more particularly, to an ultra-thin fin LED electrode assembly, a manufacturing method thereof, and a light source including the same. According to the present invention, the surface of the ultra-thin fin LED device in contact with the electrode through dielectrophoresis becomes a surface rather than a side surface, thereby increasing the drivable mounting efficiency. Further, by allowing a specific surface to selectively contact the mounting electrode, the range of driving power selection can be extended to DC power. Accordingly, it is advantageous to achieve a higher luminance LED electrode assembly.

9 Claims, 20 Drawing Sheets

1000

(56) References Cited

U.S. PATENT DOCUMENTS

| | | | | |
|---|---|---|---|---|
| 2022/0044624 | A1 | 2/2022 | Chi et al. | |
| 2022/0045123 | A1* | 2/2022 | Yang .................... | H10H 29/142 |
| 2022/0209063 | A1 | 6/2022 | Do | |
| 2024/0021588 | A1 | 1/2024 | Do | |
| 2024/0021769 | A1* | 1/2024 | Do ....................... | H10H 20/857 |

FOREIGN PATENT DOCUMENTS

| | | | |
|---|---|---|---|
| KR | 101874993 | B1 | 7/2018 |
| KR | 20210132465 | A | 11/2021 |
| KR | 20210153393 | A | 12/2021 |
| KR | 20220096608 | A | 7/2022 |
| TW | 202036838 | A | 10/2020 |
| TW | 202221828 | A | 6/2022 |
| WO | 2012050888 | A2 | 4/2012 |
| WO | 2021221438 | A1 | 11/2021 |

* cited by examiner

ULTRA-THIN FIN LED ELECTRODE ASSEMBLY, MANUFACTURING METHOD THEREOF AND LIGHT SOURCE COMPRISING THE SAME

CROSS-REFERENCE TO RELATED APPLICATION

This application claims the benefit and priority of Korean Patent Application No. 10-2022-0086122 filed Jul. 13, 2022. The entire disclosure of the above application is incorporated herein by reference.

TECHNICAL FIELD

The present invention relates to an LED electrode assembly, and more particularly, to an ultra-thin fin LED electrode assembly, a manufacturing method thereof, and a light source.

BACKGROUND ART

Micro-LEDs and nano-LEDs can implement an excellent feeling of color and high efficiency and are eco-friendly materials, thereby being used as core materials for various light sources and displays. In line with such market conditions, recently, research is being conducted to develop a new nanorod LED structure or a nanocable LED having a shell coated by a new manufacturing process. In addition, research on a protective film material to achieve high efficiency and high stability of a protective film covering an outer surface of nanorods, and research and development on a ligand material that is advantageous for a subsequent process are also being conducted.

In line with the research in the field of these materials, recently, even display TVs using red, green, and blue micro-LEDs have been commercialized. Displays and various light sources using micro-LEDs have advantages of high-performance characteristics, very long theoretical lifetime, and very high efficiency, but micro-LEDs should be placed individually on miniaturized electrodes in a limited area. Thus, with electrode assembly implemented by placing the micro-LED on the electrode using pick and place technology, it is difficult to manufacture true high-resolution commercial displays ranging from smartphones to TVs or light sources with various sizes, shapes and brightness due to the limitations of process technology in view of high unit price, high process defect rate, and low productivity. In addition, it is more difficult to individually place nano-LEDs, which are smaller than micro-LEDs, on electrodes using the pick and place technology as in micro-LEDs.

In order to overcome these difficulties, Korean Patent Registration No. 10-1436123 discloses a display manufactured through a method of dropping a solution mixed with nanorod-type LEDs on subpixels and then forming an electric field between two alignment electrodes to self-align nanorod-type LED devices on the electrodes, thereby forming the subpixels. However, in the used nanorod-type LED devices, since a major axis of the LED device coincides with a stack direction of the layers constituting the device, that is, a stack direction of each layer in a p-GaN/InGaN multi-quantum well (MQW)/n-GaN stacked structure, an emission area is narrow. In addition, when manufacturing a nanorod-type LED device by etching a commercially available wafer, it is necessary to etch the wafer as much as the length of the major axis, so surface defects are highly likely to occur as a lot of etchings is performed. Further, since the emission area is narrow, surface defects have a relatively large effect on the degradation in efficiency. In addition, since it is difficult to optimize the electron-hole recombination rate, there is a problem that the luminous efficiency is significantly lower than that of an original wafer. Accordingly, there is a problem in that a large number of LEDs must be mounted in order for an apparatus to which such a nanorod-type LED device is mounted to express a desired level of luminous efficiency.

Therefore, in order to solve these problems, a structural change may be considered so that the major axis of the rod-type LED device is perpendicular to the stacking direction of each layer. In this case, the major axis should be the length and/or width of the LED device, and the thickness of the device becomes thinner compared to the length or width. Thus, the possibility of surface defects is low due to the shallow etching depth when the wafer is etched, but after etching, the area of the lower surface of the etched LED pillar connected to the wafer is large, so it is not easy to separate the etched LED pillar. In addition, it may be difficult to obtain an LED device having a desired size and efficiency because the separated LED device cannot be completely separated during separation. In addition, in the case of a rod-type LED device in which the stacking directions of the n-type semiconductor layer and p-type semiconductor layer are perpendicular to the major axis of the device, when the LED device is mounted on an electrode through dielectrophoresis by applying an electric field, the surface of the p-type semiconductor layer or n-type semiconductor layer must be self-aligned to be placed on the electrode. When the side surface of the device is self-aligned so as to be in contact with the electrode, there is a problem in that an electric short occurs when driving power is applied, and light is not emitted. In addition, even when self-aligned such that the surface of the p-type semiconductor layer or the n-type semiconductor layer of the LED device, rather than the side surface, is placed on the electrode, the layer placed on the electrode is not dominantly one of the p-type semiconductor layer and the n-type semiconductor layer, but is random or has only a slight difference. Thus, in terms of selecting a driving power source, there is a limitation that DC power cannot be selected as the driving power source for the LED electrode assembly.

DISCLOSURE

Technical Problem

The present invention has been devised to solve the above-mentioned problems, and an aspect of the present invention is to provide an ultra-thin fin LED electrode assembly, a manufacturing method thereof, and a light source including the same, wherein the ultra-thin fin LED electrode assembly uses an LED device which can increase an emission area while reducing the thickness of a photo-active layer exposed to a surface to prevent a degradation in efficiency due to surface defect, and maintain high efficiency in light extraction efficiency and further improve luminance by minimizing a decrease in electron-hole recombination efficiency due to non-uniformity of electron and hole velocities and the resulting decrease in luminous efficiency, and wherein the ultra-thin fin LED electrode assembly is capable of increasing drivable mounting efficiency by minimizing side contact that may cause an electrical short during self-alignment on a lower electrode through dielectrophoresis.

In addition, another aspect of the present invention is to provide an ultra-thin fin LED electrode assembly, a manufacturing method thereof, and a light source including the same, wherein the ultra-thin fin LED electrode assembly is capable of increasing drivable mounting ratio of the arranged LED devices while allowing a specific surface of the LED devices to selectively contact a lower electrode, thereby extending the range of selection of driving power sources to DC power, and can achieve higher luminous efficiency.

The present invention has been researched under support of National Research and Development Project, and specific information of National Research and Development Project is as follow:

[Project Series Number] 1415174040

[Project Number] 20016290(A2023-0233)

[Government Department Name] Ministry of Trade, Industry and Energy

[Project Management Authority Name] Korea Evaluation Institute of Industrial Technology

[Research Program Name] Electronic Components Industry Technology Development-Super Large Micro-LED Modular Display

[Research Project Name] Development of sub-micron blue light-emitting source technology for modular display

[Project Execution Organization Name] Kookmin University Industry Academic Cooperation Foundation

[Period of Research] Jan. 1, 2023 to Dec. 31, 2023

[Project Series Number] 1711130702

[Project Number] 2021R1A2C2009521(A2023-0130)

[Government Department Name] Ministry of Science and ICT

[Project Management Authority Name] Korea Evaluation Institute of Industrial Technology

[Research Program Name] Middle-level Researcher Support Project

[Research Project Name] Development of dot-LED material and display source/application technology

[Contribution Ratio]

[Project Execution Organization Name] Kookmin University Industry Academic Cooperation Foundation

[Period of Research] Mar. 1, 2023 to Feb. 28, 2024

Technical Solution

In order to achieve the above aspects, the present invention provides an ultra-thin fin LED electrode assembly manufacturing method comprising the steps of: (1) inputting a solution containing a plurality of ultra-thin fin LED devices onto a lower electrode line including a plurality of lower electrodes spaced apart at predetermined intervals, wherein the ultra-thin fin LED devices includes, based on mutually perpendicular x-axis, y-axis and z-axis wherein the x-axis direction is a major axis and a plurality of layers are stacked in the z-axis direction, a first surface and a second surface opposite to each other in the z-axis direction, and other side surfaces; (2) applying assembly power to the lower electrode line to self-align each of the ultra-thin fin LED devices so that the first or second surface among the various surfaces of the device comes into contact with the upper surface of the lower electrode more dominantly than the side surface; and (3) forming an upper electrode line on the plurality of self-aligned ultra-thin fin LED devices.

According to one embodiment of the present invention, the assembly power applied in step (2) may have a frequency of 1 kHz to 100 MHz and a voltage of 5 to 100 Vpp.

In addition, the plurality of layers in the ultra-thin fin LED device may include an n-type conductive semiconductor layer, a photoactive layer, and a p-type conductive semiconductor layer.

In addition, the lowermost layer having the first surface in the ultra-thin fin LED device may contain a plurality of pores in a region ranging from the first surface to a predetermined thickness.

In addition, the uppermost layer having the second surface in the ultra-thin fin LED device may have a higher electrical conductivity than that of the lowermost layer having the first surface, more preferably, the electrical conductivity of the uppermost layer may be 10 times or more than that of the lowermost layer.

In addition, in order to generate rotational torque based on an imaginary rotation axis passing through the center of the device in the x-axis direction under an electric field formed by applying the assembly power in step (2), the ultra-thin fin LED device may further include a rotation induction film surrounding the side surface of the device.

In addition, the rotation induction film may have a real part of a K(ω) value according to Equation 1 below that satisfies more than 0 and up to 0.72, and more preferably more than 0 and up to 0.62 in at least a part of frequency range within a frequency range of 10 GHz or less.

$$K(\omega) = \frac{\varepsilon_p^* - \varepsilon_m^*}{\varepsilon_p^* + 2\varepsilon_m^*} \qquad \text{[Equation 1]}$$

wherein K(ω) is an equation between $\varepsilon_p^*$, the complex permittivity of the spherical core-shell particle composed of GaN as a core part and a rotation induction film as a shell part, and $\varepsilon_m^*$, the complex permittivity of the solvent at an angular frequency ω, wherein the εp* is according to Equation 2 below:

$$\varepsilon_p^* = \varepsilon_2^* \frac{\left(\frac{R_2}{R_1}\right)^3 + 2\left(\frac{\varepsilon_1^* - \varepsilon_2^*}{\varepsilon_1^* + 2\varepsilon_2^*}\right)}{\left(\frac{R_2}{R_1}\right)^3 - \left(\frac{\varepsilon_1^* - \varepsilon_2^*}{\varepsilon_1^* + 2\varepsilon_2^*}\right)} \qquad \text{[Equation 2]}$$

In Equation 2, $R_1$ is a radius of the core part, $R_2$ is a radius of the core-shell particle, and $\varepsilon_1$* and $\varepsilon_2$* are the complex permittivity of the core part and the shell part, respectively.

Further, the width of the ultra-thin fin LED device, which is the length in the y-axis direction, may be smaller than the thickness.

In addition, the present invention provides an ultra-thin fin LED electrode assembly including: a lower electrode line comprising a plurality of lower electrodes spaced apart at predetermined intervals; a plurality of ultra-thin fin LED devices comprising, based on mutually perpendicular x-axis, y-axis and z-axis wherein the x-axis direction is a major axis and a plurality of layers are stacked in the z-axis direction, a first surface and a second surface opposite to each other in the z-axis direction, and other side surfaces, the ultra-thin fin LED devices being disposed such that one surface thereof is in contact with the upper surface of the lower electrode; and an upper electrode line disposed on the ultra-thin fin LED devices; wherein the plurality of ultra-thin fin LED devices disposed have a drivable mounting ratio of 55% or more in which the first or second surface of each device is mounted so as to come into contact with the upper surface of the lower electrode.

According to one embodiment of the present invention, the ultra-thin fin LED device may have a length of 1 to 10 μm in the x-axis direction and a thickness of 0.1 to 3 μm in the z-axis direction.

Further, the width of the ultra-thin fin LED device, which is the length in the y-axis direction, may be smaller than the thickness, which is the length in the z-axis direction.

In addition, the drivable mounting ratio of the plurality of ultra-thin fin LED devices disposed may be 70% or more.

In addition, a selective mounting ratio, which is a ratio of devices mounted such that one of the first and second surfaces thereof is in contact with the upper surface of the lower electrode among the plurality of ultra-thin fin LED devices disposed, may satisfy 70% or more, more preferably 85% or more.

In addition, the present invention provides a light source including a support, and the ultra-thin fin LED electrode assembly according to the present invention provided so that a lower electrode line thereof is disposed on the support.

According to one embodiment of the present invention, a color conversion material excited by light irradiated from the ultra-thin fin LED electrode assembly may be further included.

In addition, the ultra-thin fin LED device provided in the ultra-thin fin LED electrode assembly may be a device emitting light of any one of UV, blue, green, yellow, amber, and red.

Hereinafter, terms used in the present invention will be defined.

In the description of the embodiments according to the present invention, when each layer, region, pattern or substrate is described as being formed ""o"", ""abov"", "uppe"", ""under", "lower" or "below" another layer, region or pattern, the meaning of the terms ""o"", ""abov"", "ove"", ""unde"", "below", or "beneath includes both cases of "directly" and "indirectly".

In addition, as used in the present invention, the term "drivable mounting rati" means a ratio of the number of devices mounted in a drivable form among all LED devices mounted on the lower electrode line. For example, when the total number of LED devices mounted on the lower electrode line is L, and among them, the number of LED devices mounted so that the first surface (B) is in contact with the upper surface of the lower electrode is M, and the number of LED devices mounted such that the second surface (T) is in contact with the upper surface of the lower electrode is N, the drivable mounting ratio is calculated by the formula [(M+N)/L]×100.

In addition, the term "selective mounting rati" refers to a ratio of the number of devices mounted such that one surface selected from the first surface (B) and the second surface (T) of the device is in contact with the upper surface of the lower electrode line among all LED devices mounted on the lower electrode line. For example, when the total number of LED devices mounted on the lower electrode line is L, and among them, the number of LED devices mounted so that the first surface (B) is in contact with the upper surface of the lower electrode is M, and the number of LED devices mounted such that the second surface (T) is in contact with the upper surface of the lower electrode is N, the selective mounting ratio means the larger of the ratios calculated by the formula [M/L]×100 and [N/L]×100.

Advantageous Effects

The ultra-thin fin LED electrode assembly according to the present invention is advantageous in achieving higher luminance and light efficiency by minimizing efficiency degradation due to emission area and surface defects of the device compared to an electrode assembly using a conventional rod-type LED device. In addition, the drivable mounting ratio of the input LED devices can be increased by self-aligning so that the surface of the LED devices in contact with the electrode through dielectrophoresis becomes the surface on which the LED devices can be driven. In addition, the surface in contact with the electrode is the surface on which the LED device can be driven as described above, and further the surfaces mounted on the electrodes can be selectively adjusted so that driving is possible even when DC power is selected as the driving power," so t'at the range of selection of driving power can be extended to DC power. Therefore, a higher luminance LED electrode assembly is advantageously achieved, and thus can be widely applied to various light sources.

DESCRIPTION OF DRAWINGS

FIGS. 1 and 2 are views showing an ultra-thin fin LED electrode assembly according to an embodiment of the present invention, wherein FIG. 1 is a plan view of an ultra-thin fin LED electrode assembly, and FIG. 2 is a schematic cross-sectional view taken along line X-X' in FIG. 1.

FIGS. 11 and 12 are diagrams schematically illustrating a motion of an ultra-thin fin LED device placed in a medium above a lower electrode where an electric field is formed in step (2) included in an embodiment of the present invention when it is mounted on the lower electrode through dielectrophoretic force, wherein FIG. 11 is a diagram schematically illustrating a motion in which an ultra-thin fin LED device is drawn to two adjacent lower electrode surfaces, and FIG. 12 is a diagram schematically illustrating a rotation torque generated in an ultra-thin fin LED device based on an x-axis which is a major axis thereof.

BEST MODES OF THE INVENTION

Hereinafter, embodiments of the present invention will be described in detail with reference to the accompanying drawings so that the present invention can be easily implemented by one of ordinary skill in the art to which the present invention pertains. The present invention may be embodied in a variety of forms and is not limited to the embodiments described herein.

Figure 1:
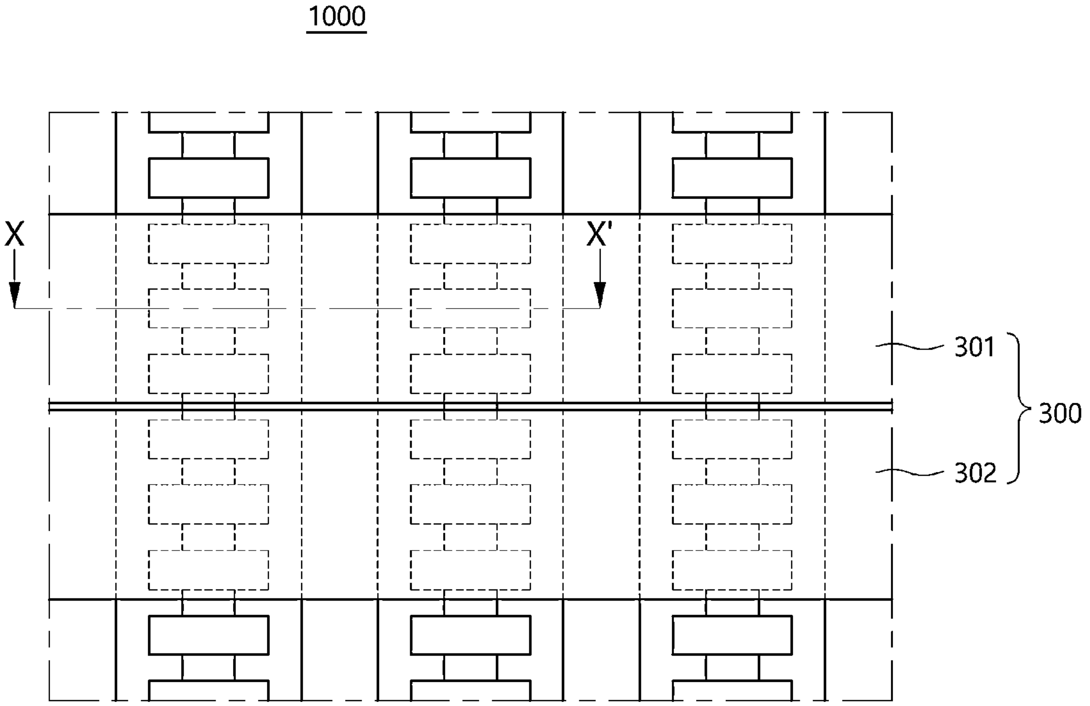
Figure 2:
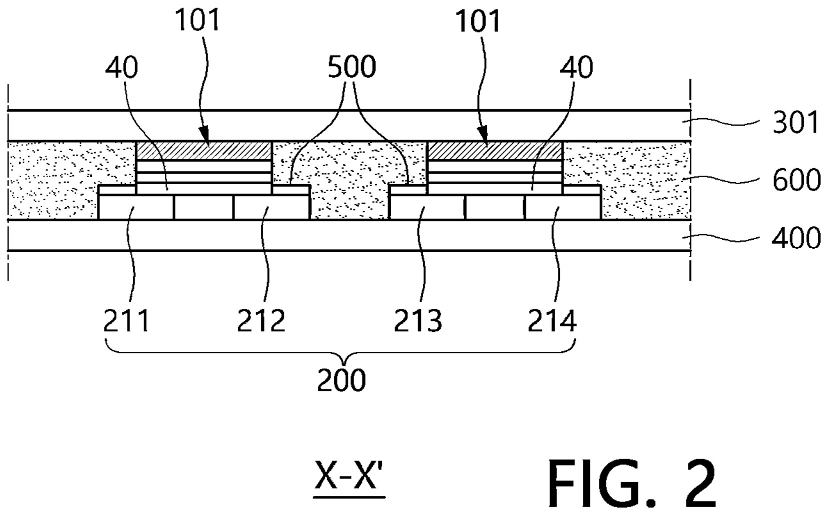
Figure 3:
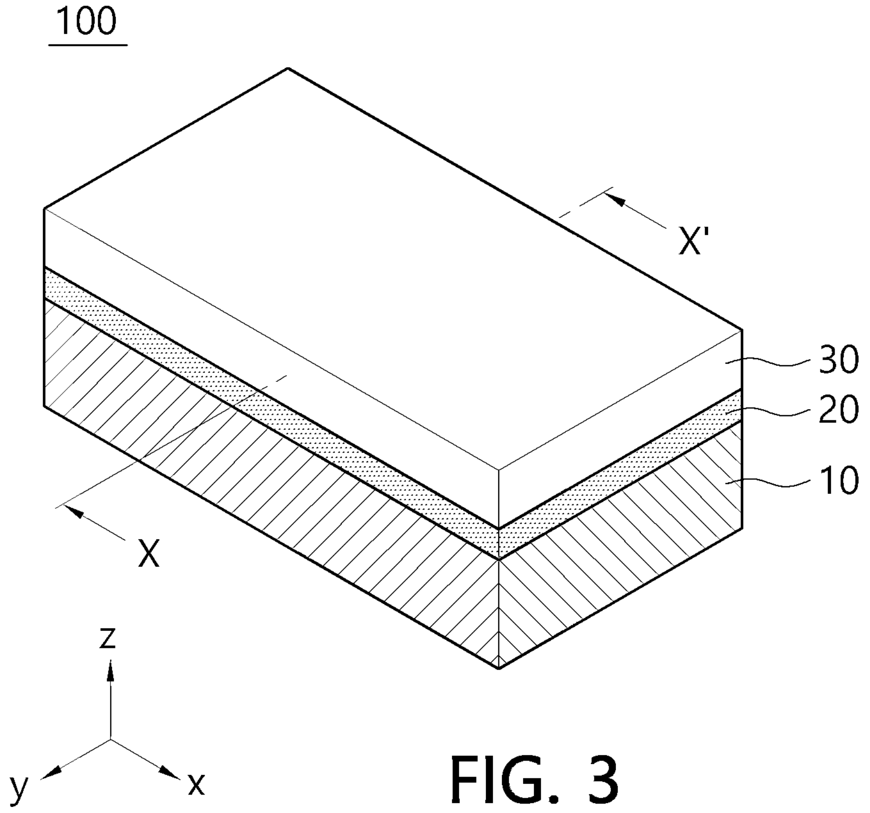
FIGS. 3 and 4 are a perspective view of an ultra-thin fin LED device included in an embodiment of the present invention and a cross-sectional view taken along line X-X', respectively.

Referring to FIGS. 1 and 2, the ultra-thin fin LED electrode assembly 1000 according to an embodiment of the present invention is implemented to include a lower electrode line 200 comprising a plurality of lower electrodes 211, 212, 213 and 214 spaced apart at predetermined intervals, a plurality of ultra-thin fin LED devices 101 disposed on the lower electrode line 200, and an upper electrode line 300 disposed on the ultra-thin fin LED device 101.

The ultra-thin fin LED electrode assembly 1000 can be manufactured using a manufacturing method in which the ultra-thin fin LED devices 101 are self-aligned on the lower electrodes 211, 212, 213 and 214 through dielectrophoretic force by using an electric field formed by the assembly power applied to the lower electrode line 200. Here, each of the ultra-thin fin LED devices 101 has, based on mutually perpendicular x-axis, y-axis and z-axis wherein a plurality of layers are stacked in the z-axis direction, a first surface and a second surface attached to each other in the z-axis direction, and other side surfaces, wherein as the ultra-thin fin LED devices 101 positioned in the electric field are attracted toward the lower electrodes 211, 212, 213 and 214 by dielectrophoretic force, they are self-aligned such that the first or second surface among the various surfaces of each of the ultra-thin fin LED devices 101 contacts the upper surfaces of the lower electrodes 211, 212, 213 and 214 more dominantly than the side surfaces, and specifically, can be manufactured through the following manufacturing method.

Specifically, the ultra-thin fin LED electrode assembly 1000 according to an embodiment of the present invention can be manufactured through the steps of: (1) inputting a solution containing the ultra-thin fin LED devices 101 onto a lower electrode line 200 including a plurality of lower electrodes 211, 212, 213 and 214 spaced apart at predetermined intervals; (2) self-aligning the ultra-thin fin LED devices 101 on the lower electrodes 211, 212, 213 and 214 by applying assembly power to the lower electrode line 200; and (3) forming an upper electrode line 300 on the self-aligned ultra-thin fin LED devices 101.

First, as step (1) according to the present invention, a step is performed in which a solution containing a plurality of ultra-thin fin LED devices 101 is input onto a lower electrode line 200 including a plurality of lower electrodes 211, 212, 213 and 214 spaced apart at predetermined intervals.

Referring to FIGS. 3 to 6, the ultra-thin fin LED devices 100, 101 and 102 used in step (1) includes, based on mutually perpendicular x-axis, y-axis and z-axis wherein a plurality of layers 10, 20, 30, 40 and 60 are stacked in the z-axis direction, a first surface (B) and a second surface (T) opposite to each other in the z-axis direction, and other side surfaces (S), wherein the length in the x-axis direction is longer than the width in the y-axis direction or the thickness in the z-axis direction, and thus, the ultra-thin fin LED devices 100, 101 and 102 are rod-type LED devices in which the x-axis direction becomes a major axis thereof.

Meanwhile, as known, the rod-type LED device can be self-aligned on the lower electrodes 211, 212, 213 and 214 by dielectrophoretic force within an electric field formed by the power applied to the lower electrode line 200 corresponding to the mounting electrode, wherein each of ends in the direction of the major axis of the rod-type LED device is generally disposed to contact two adjacent lower electrodes 211/212 and 213/214 to which power is applied.

In this case, when several layers constituting the device are stacked in the x-axis direction, which is the major axis of the rod-type LED device, one end of the rod-type LED device in the direction of the major axis becomes one conductive semiconductor layer or a layer adjacent thereto, and the other end in the direction of the major axis becomes another conductive semiconductor layer or a layer adjacent thereto. When these rod-type LED devices are mounted on lower electrodes spaced apart from each other through dielectrophoretic force, it is mounted so that one end of the rod-type LED device in the direction of the major axis is in contact with one lower electrode, and the other end in the major axis direction is in contact with another spaced apart lower electrode. Therefore, there is no case where the mounted rod-type LED device is not driven. In addition, in the case of a rod-type LED device having such a laminated structure, even if the shape is a polyhedron, for example, a rectangular parallelepiped, any of the side surfaces whose plane direction is parallel to the major axis direction can be driven even in contact with the lower electrode.

However, as shown in FIGS. 3 to 6, in case the layers 10, 20, 30, 40 and 60 constituting the ultra-thin fin LED devices 100, 101 and 102 are stacked in the z-axis direction perpendicular to the x-axis direction, which is the major axis direction of the device, not in the x-axis direction, there is a limitation that driving is possible only when a surface other than the side surfaces of the device based on the direction in which the layers are stacked (corresponding to the z-axis direction), that is, the first surface (B) or the second surface (T) facing each other in the z-axis direction is in contact with the lower electrodes 211, 212, 213 and 214.

Figure 7:
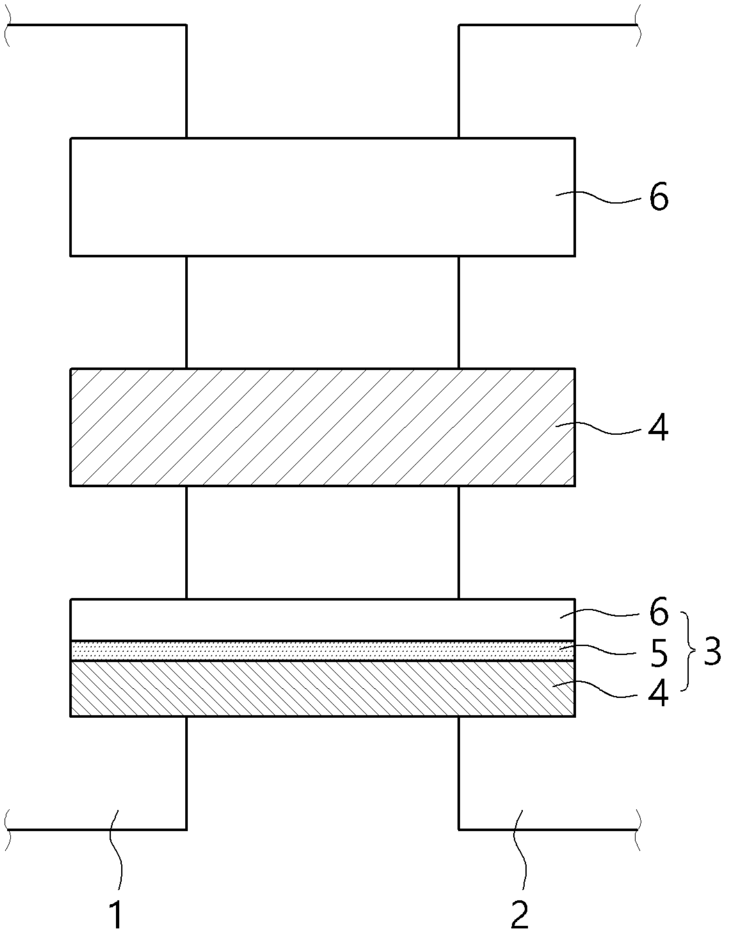
FIG. 7 is a schematic diagram of a mounting form that may appear when a rod-type device in which several layers are stacked in the thickness direction and a major axis in the longitudinal direction is perpendicular to the thickness direction is mounted on a mounting electrode.

Referring to FIG. 7, the ends of the LED device 3 in the major axis direction are self-aligned to be in contact with each of the two adjacent lower electrodes 1 and 2 through dielectrophoresis. As the stacking direction of the layers 4, 5 and 6 constituting the LED device 3 becomes perpendicular to the major axis direction of the device, the mounting form of the LED device 3 mounted on the two lower electrodes 1 and 2 is divided into a case where the first conductive semiconductor layer 4 or the second conductive semiconductor layer 6 facing in the thickness direction of the LED device 3 is in contact with the surfaces of the two lower electrodes 1 and 2, and a case the side surfaces of the LED device 3 are in contact therewith. Among these mounting forms, when the side surfaces of the LED device 3 are mounted so as to contact the two lower electrodes 1 and 2, all of the first conductive semiconductor layer 4, the photoactive layer 5 and the second conductive semiconductor layer 6 come into contact with the lower electrodes 1 and 2, whereby when driving power is applied to the upper electrodes (not shown) and the lower electrodes 1 and 2, light emission (driving) fails and an electrical short is caused.

Therefore, in the case of the ultra-thin fin LED devices 100, 101 and 102 having a first surface (B) and a second surface (T), and other side surfaces (S) based on mutually perpendicular x-axis, y-axis and z-axis wherein the first surface (B) and second surface (T) are opposite to each other in the z-axis direction in which the layers 10, 20, 30, 40 and 60 are stacked, and the x-axis direction becomes the major axis of the device, as in the LED device employed in the present invention, in order to be mounted on the two lower electrodes 211, 212, 213 and 214 by dielectrophoresis and to further emit light (be driven), they should be mounted such that the first surface (B) or the second surface (T) among the various surfaces constituting the ultra-thin fin LED devices 100, 101 and 102 is in contact with the lower electrodes 211, 212, 213 and 214. Furthermore, in order to use DC power as a driving power source, a selective alignment should be increased in which many of the ultra-thin LED devices 100, 101 and 102 mounted on the lower electrodes 211, 212, 213 and 214 are mounted so that a specific one of the first surface (B) and the second surface (T) selectively contacts the upper surface of the lower electrodes 211, 212, 213 and 214.

Accordingly, for a rod-type LED device in which the stacking direction of the layers constituting the LED device is perpendicular to the major axis direction of the device as described above, the present inventors have continuously studied the structure, shape and the like of the ultra-thin fin LED device in which a specific surface among several surfaces constituting the ultra-thin fin LED devices 100, 101 and 102 can selectively contact a lower electrode so that the device can be driven or driven with a DC power. As a result, the present inventors have found that an LED electrode assembly can be implemented by performing dielectrophoresis such that the first surface (B) or the second surface (T) of the device comes into contact with the upper surface of the lower electrode more dominantly than the side surfaces (S) through the design of the material, structure and the like of the layers constituting the LED device, and power conditions that can give attraction by dielectrophoretic force to the desired direction and position corresponding to the designed LED device, and have reached the present invention.

Specifically, the movement of particles in a medium during dielectrophoresis can be explained through a dielectrophoresis mechanism, wherein the dielectrophoresis refers to a phenomenon in which a directional force is applied to a particle by a dipole induced in the particle when the particle is placed in a non-uniform electric field. Here, the strength of the force may vary depending on the electrical characteristics of the particles and the medium, the dielectric characteristics, the frequency of the alternating electric field, etc., and the time average force ($F_{DEP}$) applied to the particles during the dielectrophoresis is shown in Equation 3 below.

$$F_{DEP}=2\pi r^3\varepsilon_m \operatorname{Re}[K(\omega)]\nabla|E|^2 \qquad \text{[Equation 3]}$$

In Equation 3, r, $\varepsilon_m$, and E represent the radius of the particle, the permittivity of the medium, and the magnitude of the mean square root of the applied alternating current electric field, respectively. In addition, Re[K(ω)] is a factor that determines the direction in which the near-spherical particles move, and means a real part of the value according to Equation 1 below.

$$K(\omega) = \frac{\varepsilon_p^* - \varepsilon_m^*}{\varepsilon_p^* + 2\varepsilon_m^*} \qquad \text{[Equation 1]}$$

Here, $\varepsilon_p^*$ and $\varepsilon_m^*$ are the complex permittivity of the particle and the medium, respectively, and $\varepsilon^*$ is determined by Equation 4 below.

$$\varepsilon^* = \varepsilon - j\frac{\sigma}{\omega} \qquad \text{[Equation 4]}$$

Here, σ refers to an electrical conductivity coefficient, ε refers to a dielectric constant, ω refers to an angular frequency (ω=2πf), and j refers to an imaginary part ($j=\sqrt{-1}$)

The movement of the particles during dielectrophoresis greatly depends on the change of the factor according to Equation 1. In other words, the sign change according to the frequency of Re[K(ω)] is the most important factor in determining the direction for the phenomenon in which particles move toward or away from a high electric field region. In this case, if Re[K(ω)] has a positive value, the particles move toward a high electric field region, which is called positive dielectrophoresis (pDEP), whereas if Re[K(ω)] has a negative value, the particles move away from the high electric field region, which is called negative dielectrophoresis (nDEP).

The ultra-thin fin LED devices 100, 101 and 102 are subjected to dielectrophoretic force while being dispersed in a solvent as a medium. Table 1 below shows the electrical conductivity and dielectric constant for each kind of materials that may be included in the solvent and the ultra-thin fin LED devices 100, 101 and 102.

TABLE 1

| | Solvent | | Materials that may be provided in the LED device | | | | | |
|---|---|---|---|---|---|---|---|---|
| | Acetone | IPA | GaN | ITO | $SiO_2$ | $SiN_x$ | $Al_2O_3$ | $TiO_2$ |
| Dielectric constant (ε) | 20.7 | 18.6 | 12.2 | 3.2 | 3.9 | 6.2 | 9.0 | 80 |
| Electrical conductivity (σ; S/m) | $20 \times 10^{-6}$ | $6 \times 10^{-6}$ | 104 | $10^5$ | $1 \times 10^{-10}$ | $2 \times 10^{-13}$ | $1 \times 10^{-14}$ | $1 \times 10^{-13}$ |

Figure 8:
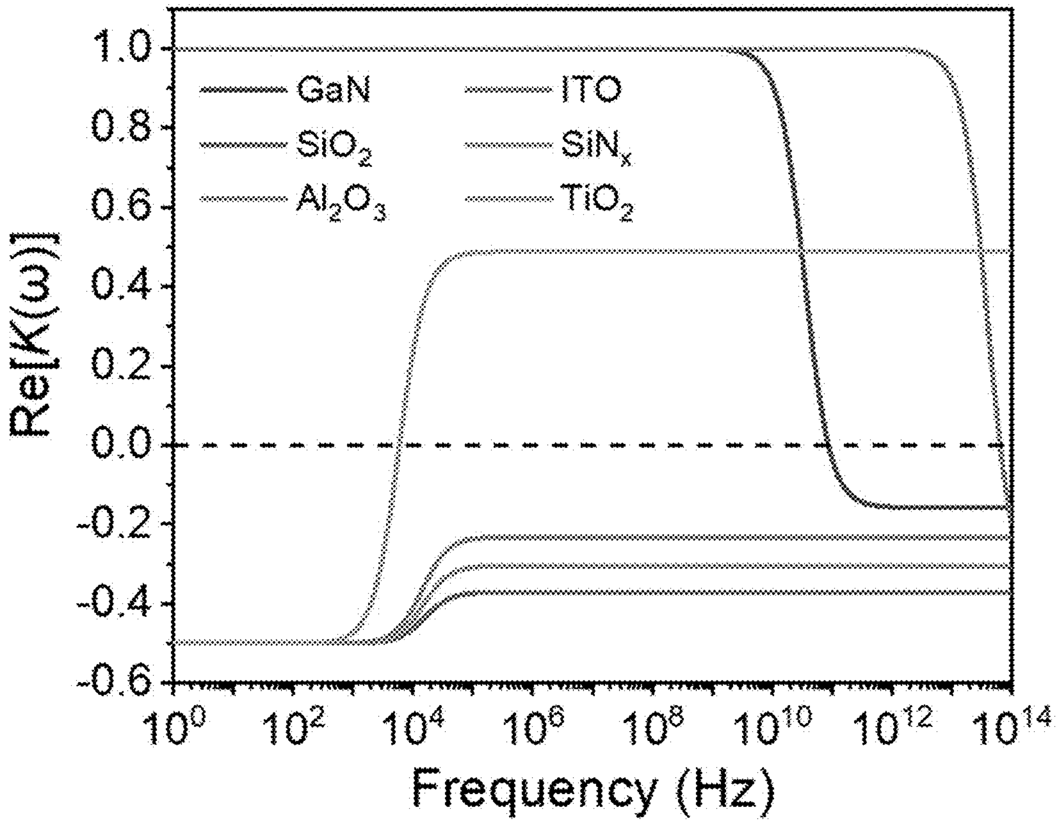
FIGS. 8 and 9 are graphs showing a real part of the value according to Equation 1 for each frequency of an electric field formed when a single particle formed of each of the materials shown is placed in a medium of acetone and isopropyl alcohol, respectively.
Figure 9:
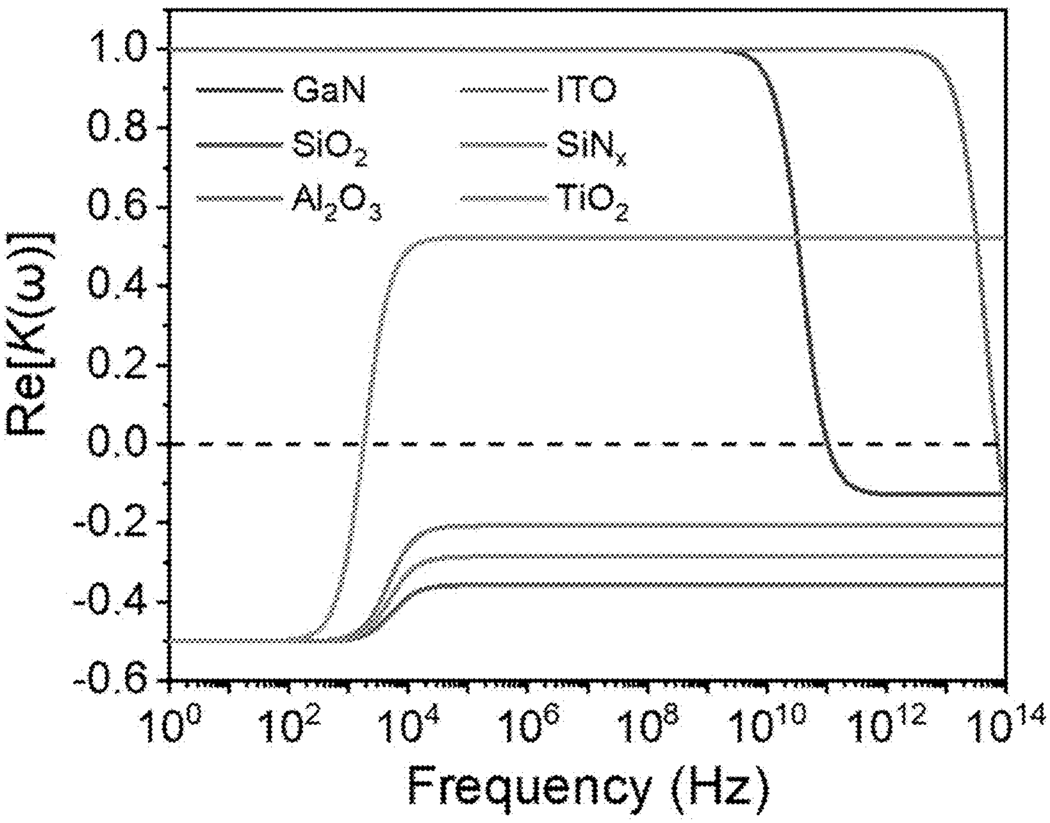
Figure 10A:
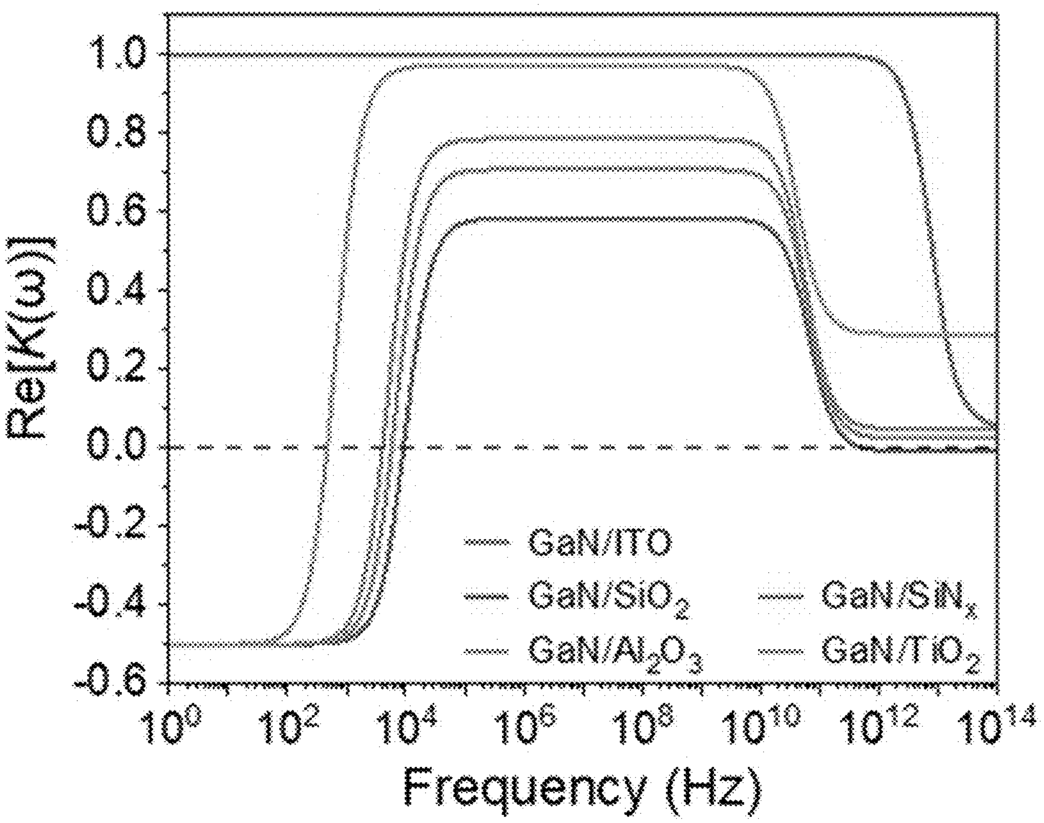
FIGS. 10A to 10D are graphs showing a real part of the value according to Equation 1 for each frequency of an electric field formed when a spherical core-shell particle in which a rotation induction film is formed with each of shown materials to have a thickness of 30 nm on a surface of a GaN core having a radius of 400 nm is placed in solvents having different permittivity of 10, 15, 20.7, and 28, respectively.
Figure 10B:
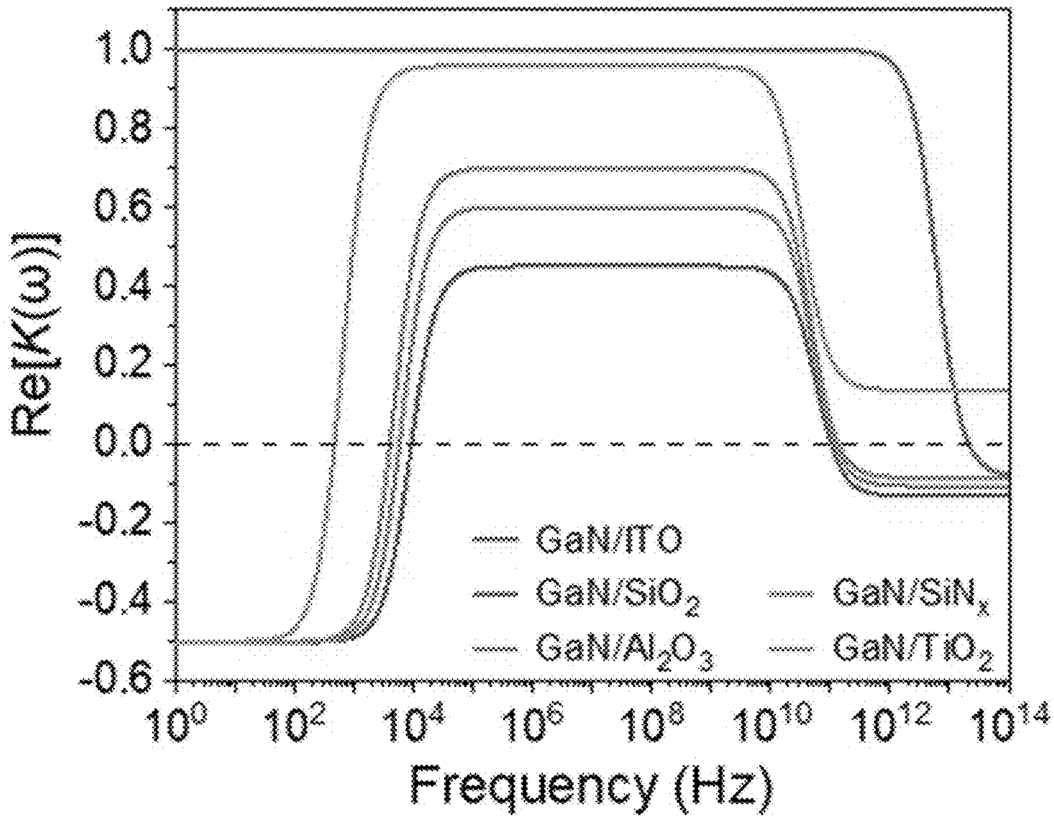
Figure 10C:
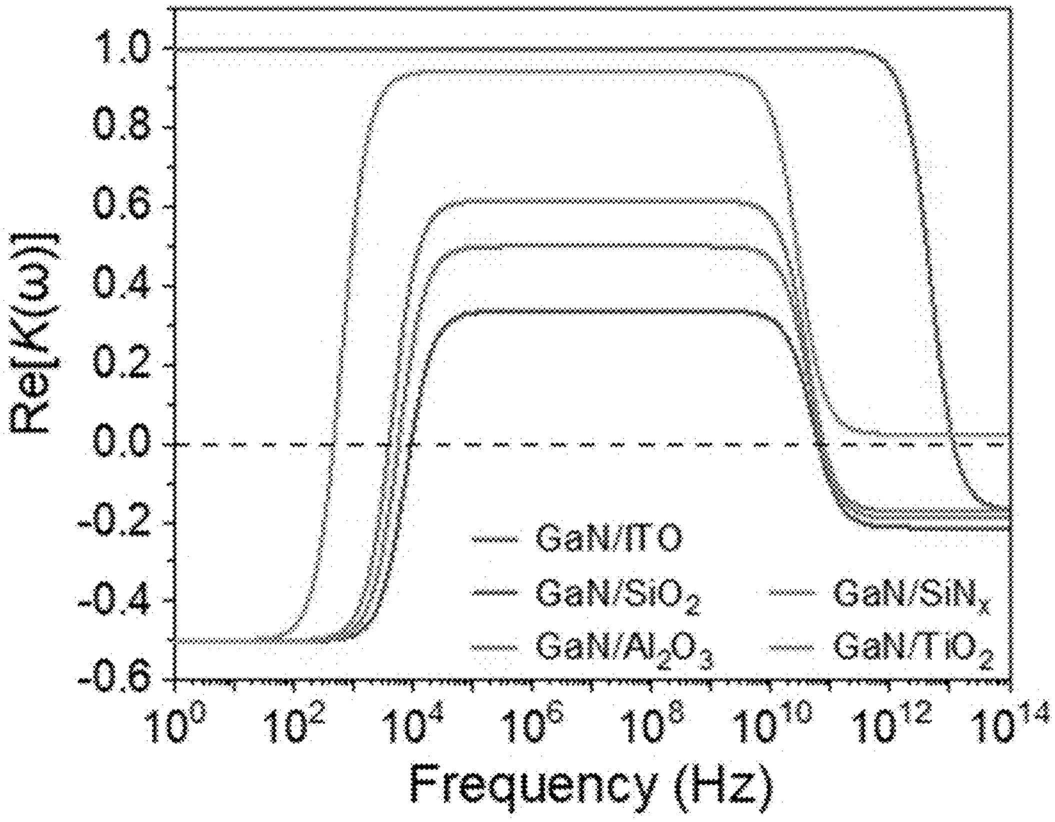
Figure 10D:
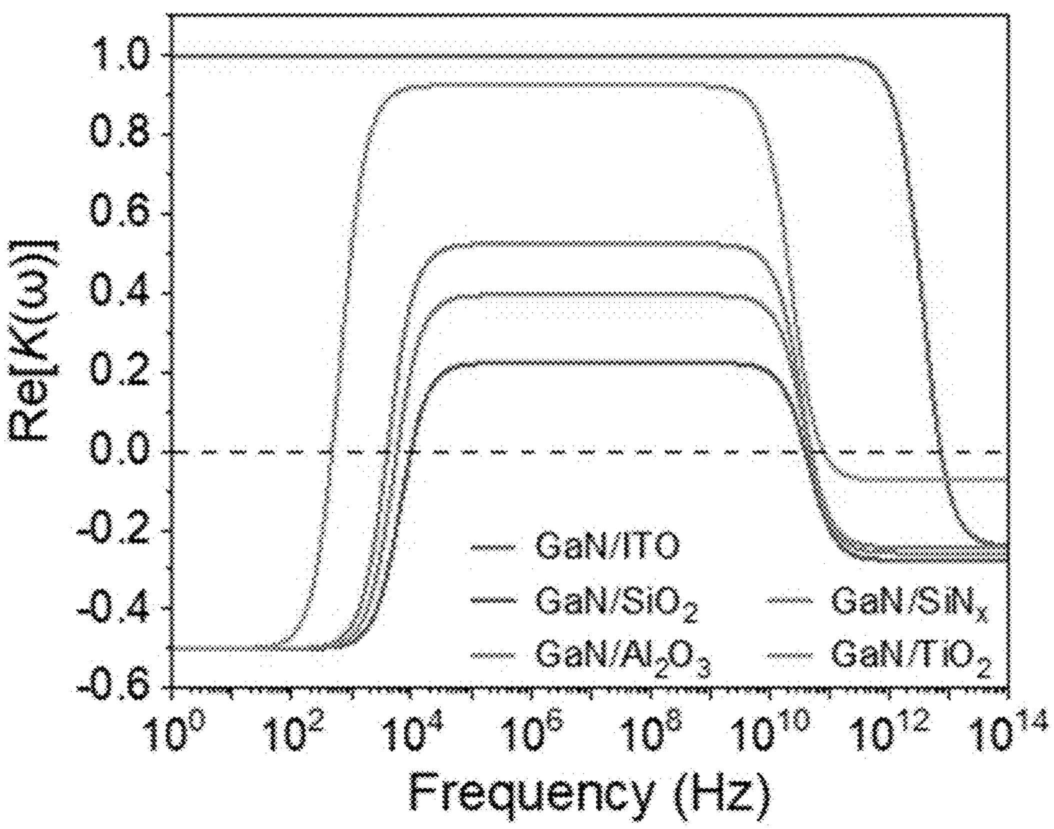

In addition, referring to FIGS. 8 and 9, assuming that a single particle is a material that can be included in the ultra-thin fin LED devices 100, 101 and 102 placed in acetone and isopropyl alcohol (IPA), respectively, as examples of the solvent, the frequency dependence of Re[K (ω)] has a positive dielectrophoretic (pDEP) value in a broad frequency range in the case of ITO and GaN, whereas on the contrary, in the case of $TiO_2$, it has a negative value at low frequencies and a positive value at high frequencies. In addition, particles of materials such as $SiO_2$, $SiN_x$, and $Al_2O$ have a negative dielectrophoretic (nDEP) value regardless of frequency. Therefore, GaN particles, ITO particles or $TiO_2$ particles have a directivity toward or away from a strong electric field depending on the frequency. In addition, particles of materials such as $SiO_2$, $SiN_x$ and $Al_2O$ always move away from the strong electric field regardless of the type of medium such as acetone and IPA and the frequency of the applied power.

Therefore, the dielectrophoretic force received by the ultra-thin fin LED device is also determined by the dielectric constant and electrical conductivity of the materials constituting the ultra-thin fin LED device and the solvent as the medium in which the ultra-thin fin LED device is placed, and the frequency of the applied power, whereby the sign (positive/negative) and level of the value of Re[K(ω)] acting on each surface of the ultra-thin fin LED device can be adjusted to control the movement so that the desired surface of the device is selectively placed on the lower electrodes. However, since the ultra-thin fin LED device is not a single device made of one material, it is almost impossible to predict the movement of the ultra-thin fin LED device in which layers of various materials are stacked by using the experimental results based on a single material as shown in FIGS. 8 and 9. Accordingly, assuming that the spherical particles are not particles of a single material, but core-shell structured particles having different electrical conductivity and dielectric constant for each layer, and considering that the particle in Equation 1 is the core-shell structured particle, the present inventors have derived the complex permittivity of the core-shell structured particles through Equation 2 below, and calculated the value of Equation 1 using the same, thereby examining the dielectrophoretic force and moving direction for each dielectric constant of a solvent as a medium and frequency of applied power.

$$\varepsilon_p^* = \varepsilon_2^* \frac{\left(\frac{R_2}{R_1}\right)^3 + 2\left(\frac{\varepsilon_1^* - \varepsilon_2^*}{\varepsilon_1^* + 2\varepsilon_2^*}\right)}{\left(\frac{R_2}{R_1}\right)^3 - \left(\frac{\varepsilon_1^* - \varepsilon_2^*}{\varepsilon_1^* + 2\varepsilon_2^*}\right)} \quad \text{[Equation 2]}$$

In Equation 2, $R_1$ is a radius of the core part, $R_2$ is a radius of the core-shell particle, and $\varepsilon_1^*$ and $\varepsilon_2^*$ are the complex permittivity of the core part and the shell part, respectively.

Referring to FIGS. 10A to 10D, FIGS. 10A to 10D show a real part of the value according to Equation 1 for each dielectric constant of the solvent and frequency of the applied power with respect to a spherical core-shell particle with a radius of 430 nm in which the core part is fixed to GaN having a radius of 400 nm and the shell part is changed to ITO, $SiO_2$, $SiN_x$, $Al_2O_3$, and $TiO_2$ each having a thickness of 30 nm. Specifically, as confirmed in FIGS. 8 and 9, each of GaN and ITO has a positive dielectrophoretic (pDEP) value close to 1 even in a fairly large high frequency band in the case of a single particle, whereas FIGS. 10A to 10D show that even in the case of particles having a core-shell structure in which ITO is disposed as a shell part in GaN as a core part, it still has a large positive dielectrophoretic (pDEP) value close to 1. In addition, it can be seen that in the case of core-shell structured particles in which $TiO_2$ is disposed as a shell part in GaN as a core part, $TiO_2$ is affected by GaN having a large positive dielectrophoretic value when being a single particle, and thus, has a larger positive dielectrophoretic (pDEP) value than when being a single particle, but the frequency band having a positive dielectrophoretic (pDEP) value is reduced compared to the case of $TiO_2$ single particle. On the other hand, in the case of $SiO_2$, $SiN_x$ and $Al_2O_3$, each of which had a negative dielectrophoretic (nDEP) value in a single particle, they are influenced by the large positive dielectrophoretic (pDEP) value of GaN disposed as a shell in core-shell structured particles having a core part that is GaN, and thus, change to have a positive dielectrophoretic (pDEP) value in some frequency regions of the frequency range that causes GaN to have a positive dielectrophoretic (pDEP) value, more preferably a positive dielectrophoretic (pDEP) value of 1.0, for example, a frequency range of 10 GHz or less. Taking these results together, therefore, when a certain material layer is provided as the outermost layer in a Group III-nitride compound, for example, a GaN LED device, a frequency band having a positive dielectrophoretic (pDEP) value is obtained, although there is a difference in size.

Through these results, by materially and/or structurally adjusting the electrical conductivity and dielectric constant characteristics of the layers (or surfaces) constituting the ultra-thin fin LED device input in step (1), and adjusting the frequency and power of the power applied in step (2) corresponding to the material/structural characteristics to be adjusted, it is possible to implement a mounting form in which the ultra-thin fin LED device is led toward the lower electrode, and further the first surface (B) or the second surface (T) of the device is directed toward and contacts the upper surface of the lower electrode more dominantly than the side surfaces (S). In the ultra-thin fin LED devices mounted in the ultra-thin fin LED electrode assembly implemented as described above, a drivable mounting ratio can be increased, and eventually increased luminance can be achieved. In addition, electrical short circuit and leakage caused by the side surface of the ultra-thin fin LED device contacting the lower electrode can be minimized.

Hereinafter, described are the ultra-thin fin LED devices 100, 101 and 102 input in step (1), which are configured so that the first surface (B) or the second surface (T) among the various surfaces of the ultra-thin fin LED device 101 is dominantly attracted to and contacted with the upper surface of the lower electrode through step (2) as described above.

Specifically, the ultra-thin fin LED devices 100, 101 and 102 may generally include minimum layers to function as LED devices. An example of the minimum layers may include conductive semiconductor layers 10 and 30 and a photoactive layer 20.

As the conductive semiconductor layers 10 and 30, any conductive semiconductor layer employed in a conventional LED device used for lighting, display, and the like may be used without limitation. According to a preferred embodiment of the present invention, the ultra-thin fin LED devices 100, 101 and 102 may include a first conductive semiconductor layer 10 and a second conductive semiconductor layer 30, wherein any one of the first conductive semiconductor layer 10 and the second conductive semiconductor layer 30 may include at least one n-type semiconductor layer, and the other conductive semiconductor layer may include at least one p-type semiconductor layer.

When the first conductive semiconductor layer 10 includes an n-type semiconductor layer, the n-type semiconductor layer may be at least one selected from semiconductor materials having an empirical formula of $In_xAl_yGa_{1-x-y}N$ ($0 \le x \le 1$, $0 \le y \le 1$, $0 \le x+y \le 1$), for example, InAlGaN, GaN, AlGaN, InGaN, AlN, InN, and the like, and may be doped with a first conductive dopant (e.g., Si, Ge, Sn, etc.). According to a preferred embodiment of the present invention, the thickness of the first conductive semiconductor layer 10 including an n-type semiconductor layer may be 0.2 to 3 μm, but is not limited thereto.

In addition, when the second conductive semiconductor layer 30 includes an p-type semiconductor layer, the p-type semiconductor layer may be at least one selected from semiconductor materials having an empirical formula of $In_xAl_yGa_{1-x-y}N$ ($0 \le x \le 1$, $0 \le y \le 1$, $0 \le x+y \le 1$), for example, InAlGaN, GaN, AlGaN, InGaN, AlN, InN, and the like, and may be doped with a second conductive dopant (e.g., Mg). According to a preferred embodiment of the present invention, the thickness of the second conductive semiconductor layer 30 including an p-type semiconductor layer may be 0.01 to 0.35 μm, but is not limited thereto.

Next, the photoactive layer 20 may be formed between the first conductive semiconductor layer 10 and the second conductive semiconductor layer 30, and may be formed in a single or multiple quantum well structure. As the photoactive layer 20, any photoactive layer included in a conventional LED device used for lighting, display, etc. may be used without limitation. A clad layer (not shown) doped with a conductive dopant may be formed above and/or below the photoactive layer 20, wherein the clad layer doped with a conductive dopant may be implemented as an AlGaN layer or an InAlGaN layer. In addition, materials such as AlGaN and AlInGaN may also be used as the photoactive layer 20. In the photoactive layer 20, when an electric field is applied to the device, electrons and holes respectively moving from the conductive semiconductor layers positioned above and below the photoactive layer to the photoactive layer are coupled to generate electron-hole pairs in the photoactive layer, thereby emitting light. According to a preferred embodiment of the present invention, the photoactive layer 20 may have a thickness of 30 to 300 nm, but is not limited thereto.

In addition, the ultra-thin fin LED devices 100, 101 and 102 are illustrated as including the first conductive semiconductor layer 10, the photoactive layer 20, and the second conductive photoactive layer 30 as minimum components, but may further other active layers, conductive semiconductor layers, phosphor layers, hole blocking layers, and/or electrode layers above/below each of the above layers.

Meanwhile, with only the above-described conductive semiconductor layers 10 and 30 and the photoactive layer 20, it may be difficult for the first surface (B) or the second surface (T) among the various surfaces of the ultra-thin fin LED device to be dominantly attracted to and contacted with the upper surface of the lower electrode. Accordingly, in order to increase the drivable mounting ratio in which the ultra-thin fin LED devices are mounted on the upper surface of the lower electrode so as to be drivable through step (2) described later and the selective mounting ratio in which the LED devices can be driven (emitted) even by DC power, the ultra-thin fin LED devices 100, 101 and 102 may be configured to have different materials and/or structures depending on positions within the device.

Figure 4:
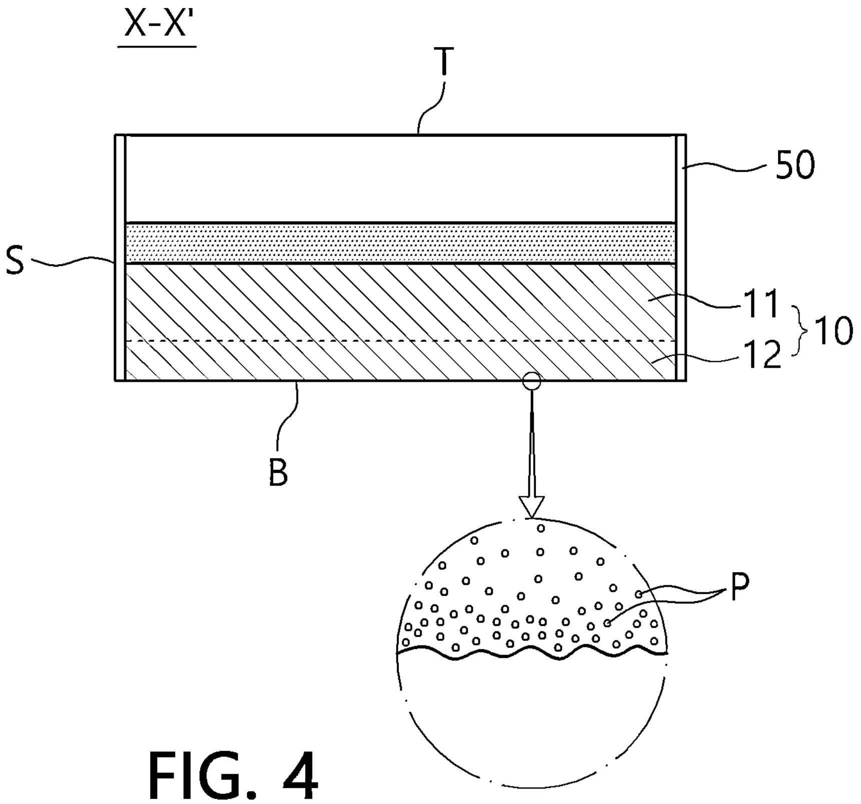

For example, as shown in FIG. 4, the ultra-thin fin LED device 100 may have a structure containing a plurality of pores (P) in a region 12 extending from the first surface (B) of the first conductive semiconductor layer 10 corresponding to a lowermost layer having the first surface (B) to a predetermined thickness, wherein the structure containing the plurality of pores (P) further lowers the dielectric characteristics and electrical conductivity due to the air contained in the pores (P). Therefore, its material and structure may be different from those of the second conductive semiconductor layer 30 corresponding to the uppermost layer having the second surface (T). In addition, the structure containing the plurality of pores (P) has the advantage of increasing the luminous efficiency by preventing the light emitted from the inside of the ultra-thin fin LED device 100 from being trapped and unable to escape due to internal reflection. On the other hand, the structure containing the plurality of pores (P) may be formed in the n-type GaN portion which is etched through the LED wafer to a partial thickness of the n-type GaN semiconductor in the shape and size of the ultra-thin fin LED device, and then exposed to an etching solution after electrochemical etching treatment to separate the etched LED structure from the LED wafer. In relation to this ultra-thin fin LED device 100, reference may be made to Korean Patent Application No. 10-2020-0189204 of the present inventors, which is incorporated herein by reference. Meanwhile, for example, the pores may have a diameter of 1 to 100 nm.

Alternatively, according to another embodiment of the present invention, in the ultra-thin fin LED devices 102 and 103 used in step (1), the lowermost layer having the first surface (B) and the uppermost layer having the second surface (T) may be made of materials that differ in at least one of electrical conductivity and dielectric constant from each other. Preferably, they may differ in the electrical conductivity, and for example, the electrical conductivity of the uppermost layer having the second surface (T) may be greater than that of the lowermost layer having the first surface (B). More preferably, the electrical conductivity of the uppermost layer may be 10 times or more, more preferably 100 times or more of that of the lowermost layer, whereby it may be advantageous to achieve a further increased selective mounting ratio.

Figure 5:
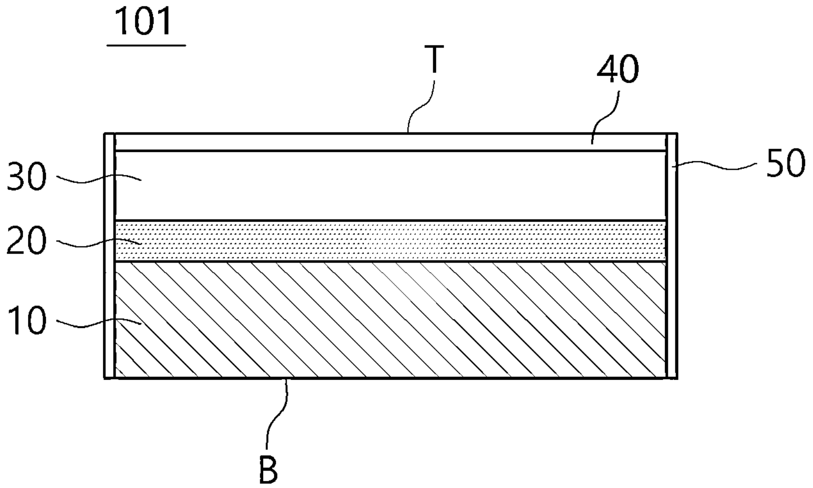
FIGS. 5 and 6 are cross-sectional views perpendicular to a longitudinal direction of ultra-thin fin LED devices included in various embodiments of the present invention.
Figure 6:
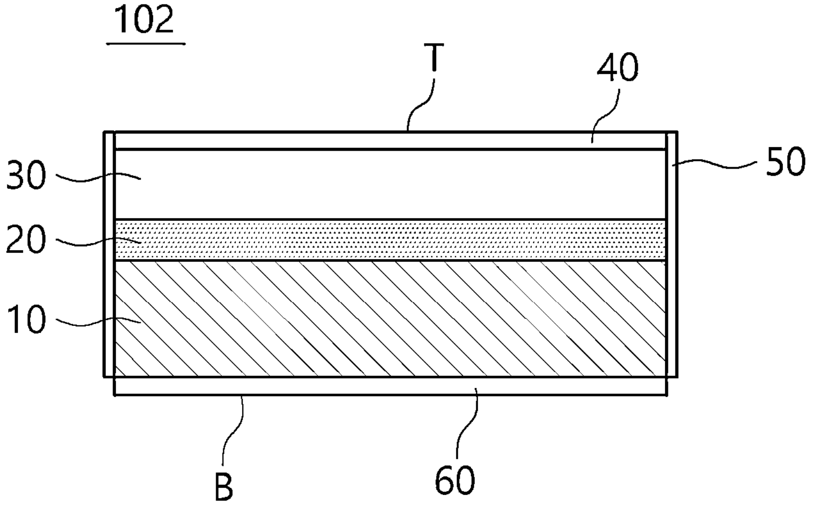

Referring to FIGS. 5 and 6, for example, the ultra-thin fin LED devices 101 and 102 may include, in addition to the first conductive semiconductor layer 10, the photoactive layer 20 and the second conductive semiconductor layer 30, a selective alignment-directing layer 40 or a selective alignment-retarding layer 60 above or below the second conductive semiconductor layer 30 or the first conductive semiconductor layer 10 to provide them as the uppermost layer having the second surface (T) of the ultra-thin fin LED devices 101 and 102 or the lowermost layer having the first surface (B).

The selective alignment-directing layer 40 may be made of a material having higher electrical conductivity than that of the first conductive semiconductor layer 10, and may be an electrode layer as a specific example. As the electrode layer, any conventional electrode layer provided in an LED device may be used without limitation, and as non-limiting examples, Cr, Ti, Al, Au, Ni, ZnO, AZO, ITO, and oxides or alloys thereof may be used alone or in combination. Preferably, in order to increase the selective mounting ratio in which the second surface (T) contacts the upper surface of the mounting electrode compared to other electrode layer materials, the electrical conductivity of the selective alignment-directing layer 40 may be 10 times or more, more preferably 100 times or more, of that of the first conductive semiconductor layer 10, whereby, it may be advantageous to achieve a further increased selective mounting ratio. In addition, when the selective alignment-directing layer 40 is an electrode layer, the thickness may be 10 to 500 nm, but is not limited thereto.

Alternatively, the selective alignment-retarding layer 60 may be made of a material having lower electrical conductivity than that of the second conductive semiconductor layer 30, and may be, for example, an electronic delay layer having an electronic delay function. That is, as the ultra-thin fin LED device 102 is implemented such that the thickness in the stacking direction of each layer is smaller than the length thereof, the thickness of the n-type GaN layer is bound to be relatively thin. In contrast, since the movement speed of electrons is greater than that of holes, the coupling position of the electrons and the holes may be made in the second conductive semiconductor layer 30 rather than in the photoactive layer 20, thereby reducing luminous efficiency. The selective alignment-retarding layer 60, which is the electron delay layer, balances the number of recombined holes and electrons in the photoactive layer 20, thereby increasing the probability that the second surface (T) among several surfaces selectively contacts the lower electrodes 211, 212, 213 and 214 while preventing a decrease in luminous efficiency. Preferably, the electrical conductivity of the uppermost layer, for example, the second conductive semiconductor layer 30, may be 10 times or more, more preferably 100 times or more, of that of the selective alignment-retarding layer 60, whereby it may be advantageous to further improve the selective mounting ratio in which the second conductive semiconductor layer 30 contacts the upper surface of the lower electrodes 211, 212, 213 and 214.

The electronic delay layer may contain, for example, at least one selected from the group consisting of CdS, GaS, ZnS, CdSe, CaSe, ZnSe, CdTe, GaTe, SiC, ZnO, ZnMgO, $SnO_2$, $TiO_2$, $In_2O_3$, $Ga_2O_3$, Si, polyparaphenylene vinylene and its derivatives, polyaniline, poly(3-alkylthiophene), and poly(paraphenylene). Alternatively, when the electronic delay layer is an n-type III-nitride semiconductor layer doped with the first conductive semiconductor layer 10, it may be composed of a III-nitride semiconductor having a lower doffing concentration than that of the first conductive semiconductor layer 10. In addition, the thickness of the electronic delay layer may be 1 to 100 nm, but is not limited thereto, and may be appropriately changed in consideration of the material of the n-type conductive semiconductor layer, the material of the electronic delay layer, and the like.

Alternatively, according to another embodiment of the present invention, in order to generate rotational torque ($T_x$) based on an imaginary axis of rotation passing through the center of the device in the x-axis direction, which is the major axis of the ultra-thin fin LED device, under an electric field formed by the assembly power applied to the lower electrodes 211, 212, 213 and 214 in step (2) described later, the ultra-thin fin LED devices 100, 101 and 102 may further include a rotation induction film 50 surrounding the side surface thereof. More preferably, in order for any specific one of the first surface (B) and the second surface (T), for example, the second surface (T) to be selectively directed toward the upper surface of the lower electrode, the rotation induction film 50 covering the side surfaces S of the device may be formed of a material that satisfies the real part of the K(ω) value according to Equation 1 greater than 0 and up to 0.72, more preferably greater than 0 and up to 0.62, as calculated in at least a part of the frequency range within the range where the frequency of the power applied in consideration of the permittivity of the solvent is 10 GHz or less, assuming that the particles in Equation 1 above are spherical core-shell particles composed of GaN as the core and the rotation induction film as the shell (see FIGS. 10A to 10D).

Figure 11:
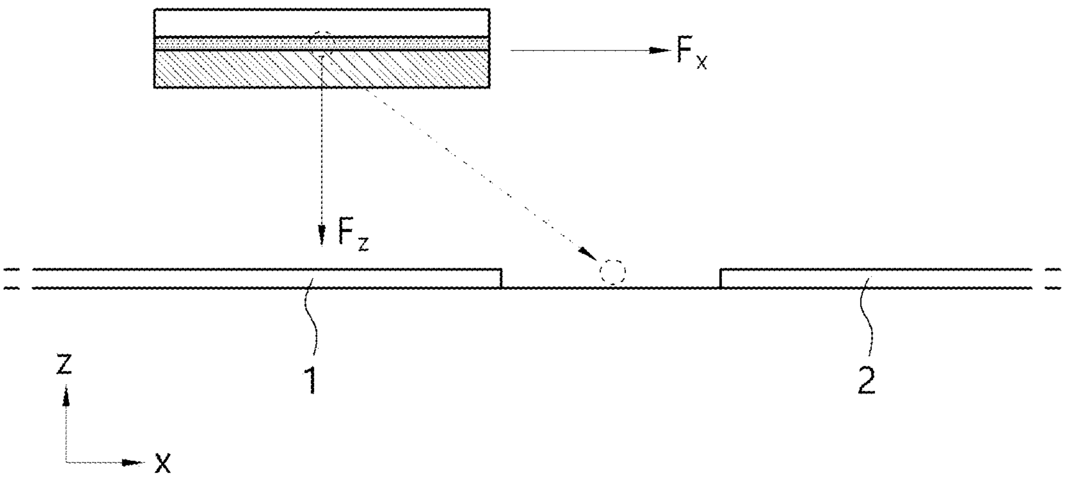
Figure 12:
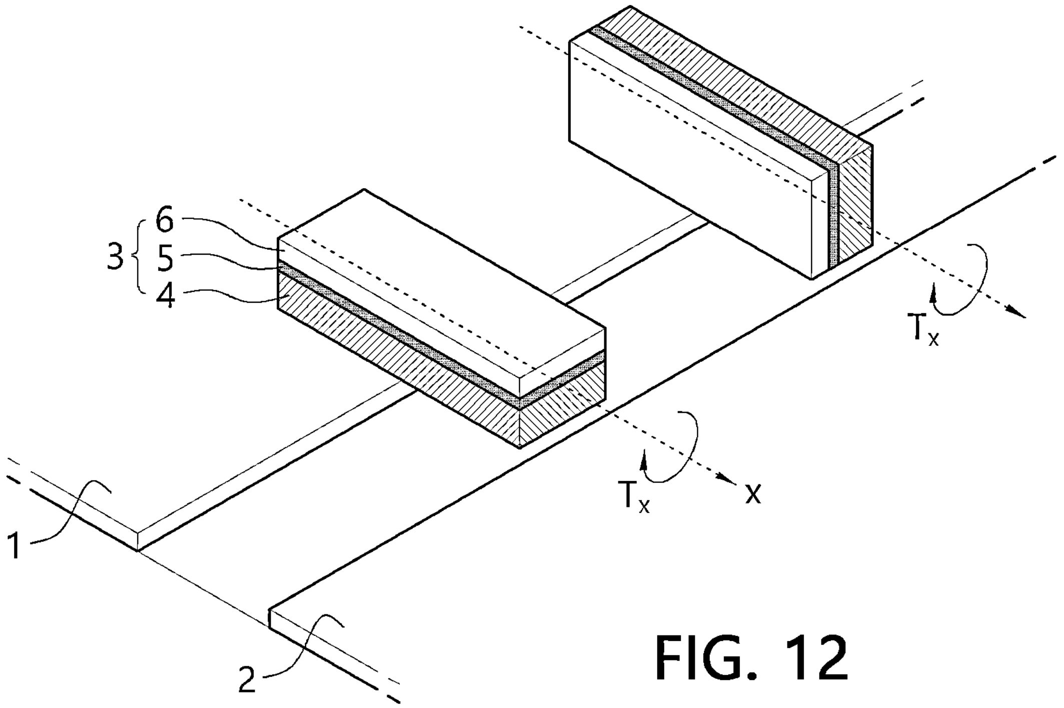

Referring to FIGS. 11 and 12, the ultra-thin fin LED device 3 may have a positive value of Re[K(ω)] in Equation 3 as described above, so that it can be attracted to the high electromagnetic field formed by the power applied to the lower electrodes 1 and 2. In this case, the rotation induction film 50 generates a rotation torque ($T_x$) based on an imaginary x-axis passing through the center of the ultra-thin fin LED device 3, so that any one surface selected from the first surface (B) and the second surface (T), for example, the second surface (T) can be rotated to face the lower electrodes 1 and 2, thereby increasing the drivable mounting ratio in which the first surface (B) or the second surface (T) of the ultra-thin fin LED device 3 is mounted to contact the upper surface of the lower electrodes 1 and 2, and further increasing the selective mounting ratio in which a specific one of the first surface (B) and the second surface (T) of the ultra-thin fin LED device 3 is mounted to contact the upper surface of the lower electrode.

In addition, the rotation induction film 50 has a positive number exceeding 0 as the real part of the K(ω) value according to Equation 1 for the spherical core-shell particle in which the lowermost layer having the first surface (B) is a GaN core part and the rotation induction film 50 is disposed as a shell part, and thus, does not hinder the movement of the ultra-thin fin LED devices 100, 101 and 102 being led toward the lower electrodes 211, 212, 213 and 214. Further, the rotation induction film 50 may adopt a material having the value of 0.72 or less, thereby significantly improving the drivable mounting ratio in which the LED devices are mounted so that they can be driven (emitted) through step (2) described later among all ultra-thin fin LED devices 100, 101 and 102 input on the lower electrode line 200, and the selective mounting ratio in which a specific one of the first surface (B) and the second surface (T) is arranged to contact the mounting electrode surface. If the side surfaces of the ultra-thin fin LED device are provided with the rotation induction film 50 having the real part of the K(ω) value according to Equation 1 which is 0 or a negative number or exceeds 0.72, the drivable mounting ratio of the ultra-thin fin LED devices mounted through step (2) described later, and the selective mounting ratio in which a specific one of the first surface (B) and the second surface (T) becomes the mounting surface (or contact surface) are reduced, and in particular, the selective mounting ratio may be greatly reduced (see Table 2).

In addition, the ultra-thin fin LED devices 100, 101 and 102 may have a different electrical conductivity and/or dielectric constant between the lowermost layer having the first surface (B) and the uppermost layer having the second surface (T) due to material and/or structural adjustment while at the same time having the side surfaces provided with the rotation induction film 50 having the real part of the K(ω) value greater than 0 and up to 0.72, thereby further increasing the drivable mounting ratio and selective mounting ratio of the ultra-thin fin LED devices in step (2) described later (see Table 2).

Figure 13:
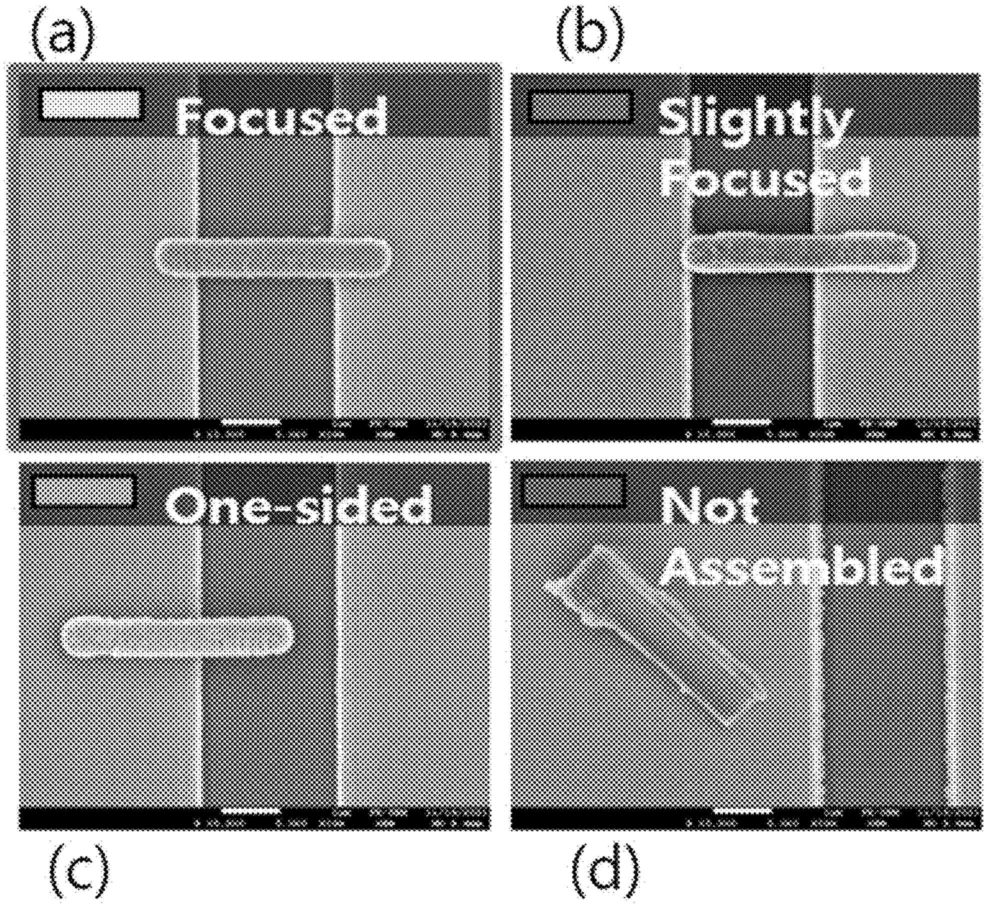
FIG. 13 is a scanning electron microscope (SEM) photograph of various mounting forms that appear after an ultra-thin fin LED device is mounted on a lower electrode through step (2) included in an embodiment of the present invention.

Meanwhile, the ultra-thin fin LED device input in the step (1) may be provided with the rotation induction film 50 satisfying the real part of the K(ω) value according to Equation 1 greater than 0 and up to 0.62 under the same conditions as described above, thereby increasing the drivable mounting ratio of the ultra-thin fin LED device, and the selective mounting ratio in which a specific one of the first surface (B) and the second surface (T) selectively contacts, while at the same time exhibiting the effect of increasing the good-quality mounting ratio, which is the mounting ratio of the ultra-thin fin LED device that enables the realization of the ultra-thin fin LED electrode assembly having good quality when the upper electrode 301 is formed on the top of the ultra-thin fin LED device self-aligned on the lower electrodes 211, 212, 213 and 214 through step (2) described later and then self-aligned through step (3). Specifically, referring to FIG. 13, even when the first surface (B) or the second surface (T) is aligned to contact the lower electrode, the mounting forms may appear as a mounting form according to (a) of FIG. 13A mounted so that each end of the ultra-thin fin LED device is positioned with a similar contact area on the adjacent lower electrode surface, a mounting form according to FIG. 13(*b*) mounted so that each end is positioned on the adjacent lower electrode surface but is biased to one side, or a mounting form according to FIG. 13(*c*) in which each end is disposed to contact only the surface of one lower electrodes among the adjacent lower electrodes. In order that the upper electrode line 300 including the upper electrode 301 formed in step (3) to be described later is formed while smoothly contacting the upper surface of the ultra-thin fin LED device, it may be advantageous to have a mounting form as shown in FIGS. 13(*a*) and 13(*b*). However, in the case of the ultra-thin fin LED device having the rotation induction film 50 whose real part of the K(ω) value deviates from more than 0 and up to 0.62, this may be undesirable for realizing good-quality ultra-thin fin LED electrode assemblies because the proportion of devices mounted in the form shown in FIG. 13(*c*) may greatly increase compared to other ultra-thin fin LED devices.

In addition, the ultra-thin fin LED devices 100, 101 and 102 input in step (1) can have a more improved emission area by stacking several layers such as the conductive semiconductor layers 10 and 30 and the photoactive layer 20 in the thickness direction and implementing the length longer than the thickness. In addition, even if the area of the photoactive layer 20 exposed as the length increases is slightly increased, since the thickness of the layers to be implemented in the process of manufacturing the ultra-thin fin LED device is thin, the depth to be etched is shallow, whereby eventually defects occurring on the exposed surfaces of the photoactive layer 20 and the conductive semiconductor layers 10 and 30 in the etching process are reduced, which is advantageous for minimizing or preventing a decrease in luminous efficiency due to surface defects.

In addition, the ultra-thin fin LED devices 100, 101 and 102 may have a longer length than a thickness such that the ratio of the total length to the thickness is, for example, 3:1 or more, more preferably 6:1 or more, which has the advantage that the ultra-thin fin LED devices 100, 101 and 102 input can be more easily self-aligned on the lower electrodes 211, 212, 213 and 214 by dielectrophoretic force through an electric field formed by the assembly power applied in step (2) described below. If the length of the ultra-thin fin LED devices 100, 101 and 102 is reduced so that the ratio of the overall length to the thickness is less than 3:1, it may be difficult to self-align the ultra-thin fin LED devices 100, 101 and 102 on the lower electrode by the dielectrophoretic force through the electric field, and it is difficult for the device to be fixed on the lower electrode, resulting in process defects, which may lead to an electrical contact short circuit. However, the ratio of the length to the thickness of the device may be 15:1 or less, which can be advantageous in achieving the aspect of the present invention, such as optimization of the turning force that can be self-aligned using an electric field.

Meanwhile, the x-y plane in the ultra-thin fin LED devices 100, 101 and 102 is shown as a rectangle in FIGS. 3 to 6, but is not limited thereto, and it should be noted that any shapes ranging from general rectangular shapes such as rhombus, parallelogram, and trapezoid to elliptical shapes can be employed without limitation.

In addition, the ultra-thin fin LED devices 100, 101 and 102 have a micro or nano size in length and width. For example, the length of the ultra-thin fin LED devices 100, 101 and 102 may be 1 to 10 μm, and the width thereof may be 0.25 to 1.5 μm. In addition, the thickness may be 0.1 to 3 μm. The length and width may have different bases depending on the shapes of the plane, and for example, when the x-y plane is a rhombus or a parallelogram, one of the two diagonals may be the length and the other may be the width, and in the case of a trapezoid, the longer of the height, upper side, and lower side may be the length, and the shorter side perpendicular to the longer side may be the width. Alternatively, when the shape of the plane is an ellipse, the major axis of the ellipse may be the length, and the minor axis may be the width.

The above-described ultra-thin fin LED devices 100, 101 and 102 are input on the lower electrode line 200 in a state of a solution dispersed in a solvent, wherein the solvent performs a function of a dispersion medium to disperse the ultra-thin fin LED devices 100, 101 and 102, and also a function of moving the ultra-thin fin LED devices 100, 101 and 102 to facilitate self-alignment on the lower electrodes 211, 212, 213 and 214. As the solvent, any solvent capable of increasing the dispersibility of the ultra-thin fin LED device without causing physical and chemical damage to the ultra-thin fin LED device can be used without limitation. In addition, the solvent may have an appropriate dielectric constant so as to have dielectrophoretic force such that the ultra-thin fin LED device dispersed in the solvent is attracted toward the lower electrode during dielectrophoresis. Preferably, the solvent may have a dielectric constant of 10.0 or more, as another example, 30 or less, and as still another example, 28 or less, which may be more advantageous to achieve the aspect of the present invention. Meanwhile, the solvent satisfying the above dielectric constant may be, for example, acetone, isopropyl alcohol, or the like. In addition, in the solution containing the ultra-thin fin LED device, the ultra-thin fin LED device may be contained in 0.01 to 99.99% by weight in the solution, but the present invention is not particularly limited thereto. In addition, the solution may be in the form of ink or paste.

Meanwhile, in step (1), the solution may be processed on the lower electrode line 200 through a known method, and a printer device such as an inkjet printer may be used for application to mass production. In addition, to be suitable for the printer apparatus and method for use in the printer apparatus or the like, the solution containing the ultra-thin fin LED device may be implemented as an ink composition. In this case, the type of solvent may be appropriately selected in consideration of physical properties such as viscosity of the solvent, and additives generally added to the composition used in the apparatus may be further included in consideration of the printing method and apparatus, but the present invention is not particularly limited thereto.

Meanwhile, although step (1) has been described as inputting the ultra-thin fin LED device in a state of a solution mixed with a solvent, the ultra-thin fin LED device may be first input on the lower electrode line 200 and then the solvent may be added, or conversely, the solvent may be first input and then the ultra-thin LED device may be input. That is, it should be noted that step (1) also includes a case in which the result is the same as that of the input of the solution.

Next, the lower electrode line 200 including the lower electrodes 211, 212, 213 and 214 functioning as one of the driving electrodes while being the mounting electrodes for mounting the above-described ultra-thin fin LED devices 100, 101 and 102 will be described. As shown in FIGS. 1 and 2, the lower electrodes 211, 212, 213 and 214 include at least two extending in one direction and spaced apart in a direction different from the one direction, whereby a high electric field may be formed between the two adjacent lower electrodes 211, 212, 213 and 214 by the power applied to the lower electrode line 200 through step (2).

In addition, the lower electrodes 211, 212, 213 and 214 serve as the mounting electrodes and also as one of the driving electrodes, wherein different types of power (for example, (+) and (−) power) are applied to the adjacent lower electrodes 211, 212, 213 and 214 only in step (2), and during driving, the same type of power (for example, (+) or (−) power) is applied. Therefore, there is an advantage in that there is less concern about an electrical short between adjacent lower electrodes 211, 212, 213 and 214, compared to a conventional LED electrode assembly that uses the lower electrodes 211, 212, 213 and 214 as the mounting electrodes and driving electrodes so that different types of power are applied during both step (2) and driving. The lower electrodes 211, 212, 213 and 214 may be formed on the base substrate 400.

In addition, the base substrate 400 can serve as a support for supporting the lower electrode line 200, the upper electrode line 300, and the ultra-thin fin LED device mounted between the lower electrode line 200 and the upper electrode line 300. The base substrate 400 may be anyone selected from the group consisting of glass, plastic, ceramic, and metal, but is not limited thereto. In addition, the base substrate 400 may preferably be made of a transparent material in order to minimize loss of light emitted from the device. In addition, the base substrate 400 may be preferably a flexible material. In addition, the size and thickness of the base substrate 400 may be appropriately changed in consideration of the size and number of the ultra-thin fin LED devices provided, the specific design of the lower electrode line 200, and the like.

In addition, the lower electrode line 200 may have the material, shape, width, and thickness of an electrode used in a conventional LED electrode assembly, and may be manufactured using a known method, so the present invention is not specifically limited thereto. For example, the lower electrodes 211, 212, 213 and 214 may be made of aluminum, chromium, gold, silver, copper, graphene, ITO, or an alloy thereof, and may have a width of 2 to 50 μm and a thickness of 0.1 to 100 μm, which may be appropriately changed in consideration of the size of the desired LED electrode assembly, and the like.

Meanwhile, in order to prevent the input ultra-thin fin LED devices 100, 101 and 102 from flowing to a portion other than the target area and to intensively place the ultra-thin fin LED devices 100, 101 and 102 on the target area, a barrier (not shown) made of sidewalls surrounding the target area at a certain height may be further provided on the lower electrode line 200, wherein the solution including the ultra-thin fin LED devices 100, 101 and 102 may be input into the barrier. The barrier may be formed of an insulating material so as not to be electrically affected when the ultra-thin fin LED device is mounted and driven in the final LED electrode assembly implemented. Preferably, the insulating material may be any one or more selected from inorganic insulating materials such as silicon dioxide ($SiO_2$), silicon nitride ($Si_3N_4$), aluminum oxide ($Al_2O_3$), hafnium oxide ($HfO_2$), yttrium oxide ($Y_2O_3$) and titanium dioxide ($TiO_2$) and various transparent polymer insulating materials. In addition, the barrier may be manufactured by forming the insulating material on the lower electrode line 200 to a certain height and then going through a patterning and etching process to form a sidewall surrounding the target region.

In this case, when the barrier is made of an inorganic insulating material, it may be formed by any one of chemical vapor deposition, atomic layer deposition, vacuum deposition, e-beam deposition, and spin coating. In addition, when the barrier is made of a polymer insulating material, it may be formed using a coating method such as spin coating, spray coating, and screen printing. In addition, the patterning may be formed through photolithography using a photosensitive material or by a known nanoimprinting method, laser interference lithography, electron beam lithography, or the like. The height of the formed barrier may be more than ½ of the thickness of the ultra-thin fin LED devices 100, 101 and 102, and may be typically a thickness that may not affect subsequent processes such as step (3), preferably 0.1 to 100 μm, more preferably 0.3 to 10 μm. If the above range is not satisfied, it may affect subsequent processes such as step (3), making it difficult to manufacture the ultra-thin fin LED electrode assembly. In particular, when the thickness of the insulator is too thin compared to the thickness of the ultra-thin fin LED devices 100, 101 and 102), there is a concern that a solution such as an ink composition containing the ultra-thin fin LED devices 100, 101 and 102 may overflow out of the barrier, and thus, it may be difficult to prevent the ultra-thin fin LED devices from spreading out of the barrier.

In addition, for the etching, an appropriate etching method may be adopted in consideration of the material of the insulator, and for example, a wet etching method or a dry etching method may be performed, and preferably, one or more dry etching methods of plasma etching, sputter etching, reactive ion etching, and reactive ion beam etching may be used.

Next, step (2) according to the present invention is performed in which assembly power is applied to the lower electrode line 200 to self-align each of the ultra-thin fin LED devices 100, 101 and 102 so that the first surface (B) or the second surface (T) among the various surfaces of the device is in contact with the upper surface of the lower electrode 211, 212, 213 and 214 more dominantly than the side surface (S).

The voltage and frequency of the assembly power applied to the lower electrode line 200 may be set to generate dielectrophoretic force having magnitude and direction such that the ultra-thin fin LED devices 100, 101 and 102 flowing in the solvent input in step (1) can be attracted to the lower electrodes 211, 212, 213 and 214, and the first surface (B) or second surface (T) of each device can dominantly contact the lower electrodes 211, 212, 213 and 214. Specifically, the assembly power may be determined in consideration of the electrical conductivity and dielectric constant of the solvent input in step (1), the size of the ultra-thin fin LED devices 100, 101, and 102, and the material and/or structure of each layer constituting the ultra-thin fin LED device. Preferably, as can be seen from the above-described FIGS. 8, 9 and 10A to 10D, the assembly power may preferably have a frequency of 1 kHz to 100 MHz and a voltage of 5 to 100 Vpp. More preferably, the assembly power supply may have a frequency of 1 kHz to 200 kHz and a voltage of 10 to 80 Vpp. If the assembly power is applied with a voltage of less than 5 Vpp and/or a frequency of less than 1 kHz, the ratio of the ultra-thin fin LED devices mounted so that the side surfaces other than the first surface (B) or the second surface (T) contact among the mounted ultra-thin fin LED devices can be increased, thereby increasing the ratio of ultra-thin fin LED devices that cannot be driven even with AC power and thus greatly reducing the luminance of the LED electrode assembly. Further, the number of ultra-thin fin LED devices wasted due to side mounting may increase. In addition, even if the mounting ratio that can be driven by AC power exceeds a certain ratio, it is difficult to increase the selective mounting ratio, making it difficult to use DC power as a driving power source. Even when DC power is used as the driving power, the achieved luminance may be lower than that obtained when AC power is used as the driving power. In addition, if the voltage exceeds 100 Vpp, the lower electrodes 211, 212, 213 and 214 may be damaged. Further, when an electrode layer is provided as the selective alignment-directing layer 40 on the uppermost layer of the ultra-thin fin LED device, the electrode layer may also be damaged. In addition, if the frequency of the power supply exceeds 100 MHz, the side surface (S) of the device is rather dominantly mounted on the lower electrode, or even when the first surface (B) or the second surface (T) is mounted on the lower electrode more dominantly than the side surface (S), the drivable mounting ratio and/or the selective mounting ratio may not be high.

As described above, the ultra-thin fin LED devices 100, 101 and 102 are self-aligned in step (2) through the application of assembly power so that the first surface (B) or the second surface (T) among the various surfaces of the device comes into contact with the upper surface of the lower electrodes 211, 212, 213 and 214 more dominantly than the side surface (S), wherein the term 'dominantly' means that for example, when 120 substantially identical ultra-thin fin LED devices are input in step (1) and self-aligned through dielectrophoretic force in step (2), the number of ultra-thin fin LED devices mounted so that the first surface (B) or the second surface (T), rather than the side surface (S), of each device independently comes into contact with the upper surface of the lower electrode exceeds 50% of the total number of input devices, and in another example, the number ratio is 55%, 60%, 65%, or 70% or more.

Next, step (3) according to the present invention is performed in which the upper electrode line 300 is formed on the plurality of self-aligned ultra-thin fin LED devices 100, 101 and 102.

The upper electrode line 300 is not limited in number, arrangement, shape, etc., as long as it is designed to electrically contact the top of the ultra-thin fin LED devices 100, 101 102 mounted on the lower electrode line 200 described above. However, as shown in FIG. 1, if the lower electrode lines 200 are arranged side by side in one direction, each of the upper electrodes 301 and 302 constituting the upper electrode line 300 may be arranged side by side in a direction perpendicular to the one direction. This electrode arrangement is a conventional electrode arrangement that has been widely used in displays, etc., and has the advantage of being able to use the conventional electrode arrangement and driving control technology in the display field as it is.

Meanwhile, in FIG. 1, only two upper electrodes 301 and 302 are shown, and the upper electrode line 300 including them is shown as covering only some devices, which is omitted for ease of explanation, but it should be noted that there are more upper electrodes disposed above the ultra-thin fin LED device, although not shown.

Meanwhile, the upper electrodes 301 and 302 may have the material, shape, width, and thickness of an electrode used in a conventional LED electrode assembly, and may be manufactured using a known method, so the present invention is not specifically limited thereto. For example, the upper electrodes 301 and 302 may be made of aluminum, chromium, gold, silver, copper, graphene, ITO, or an alloy thereof, and may have a width of 2 to 50 μm and a thickness of 0.1 to 100 μm, which may be appropriately changed in consideration of the size of the desired LED electrode assembly, and the like.

In addition, the upper electrode line 300 may be implemented by performing electrode line patterning using known photolithography, and then depositing an electrode material or depositing an electrode material followed by dry and/or wet etching, but a detailed description of the formation method is omitted.

Meanwhile, between steps (2) and (3) described above, it may further include a step of forming a conductive metal layer 500 connecting the lower electrode line 200 and the side surface of the selective directing layer 40, which is the uppermost layer having a specific surface of each ultra-thin fin LED device 101, for example, the second surface (T), in contact with the lower electrode line 200; and a step of forming a passivation layer 600 on the lower electrode line 200 without covering the upper surface of the self-aligned ultra-thin fin LED device 101.

The conductive metal layer 500 can be manufactured by applying a photolithography process using a photosensitive material to pattern a line where the conductive metal layer is to be deposited, and then depositing the conductive metal layer, or patterning the deposited metal layer and then etching it. This process may be performed by appropriately employing a known method, and reference may be made to Korean Patent Application No. 10-2016-0181410 by the present inventors, which is incorporated herein by reference.

After the conductive metal layer 500 is formed, the passivation layer 600 may be formed on the lower electrode line 200 so as not to cover the first surface (B) of the lowermost layer corresponding to the upper surface of the self-aligned ultra-thin fin LED device 101. The passivation layer 600 prevents electrical contact between the two vertically opposed electrode lines 200 and 300, and performs a function of facilitating the implementation of the upper electrode line 300. For the passivation layer 600, any passivation material commonly used in electrical and electronic components may be used without limitation. For example, the passivation layer 600 may be formed by depositing a passivating material such as $SiO_2$ and $SiN_x$ through a PECVD method, by depositing a passivating material such as AlN and GaN through the MOCVD method, or by depositing a passivating material such as $Al_2O$, $HfO_2$, and $ZrO_2$ through the ALD method. Meanwhile, the passivation layer 600 may be formed so as not to cover the upper surface of the self-aligned ultra-thin fin LED device 101. To this end, an insulating layer may be formed through deposition to a thickness that does not cover the upper surface, or may be deposited to cover the upper surface and then dry etching may be performed until the upper surface of the device is exposed.

The ultra-thin fin LED electrode assembly 1000 implemented through the above-described manufacturing method includes: a lower electrode line 200 comprising a plurality of lower electrodes 211, 212, 213 and 214 spaced apart at predetermined intervals; a plurality of ultra-thin fin LED devices 101 comprising, based on mutually perpendicular x-axis, y-axis and z-axis wherein the x-axis direction is a major axis and a plurality of layers are stacked in the z-axis direction, a first surface (B) and a second surface (T)

opposite to each other in the z-axis direction, and other side surfaces (S), the ultra-thin fin LED devices 101 being disposed such that one surface thereof is in contact with the upper surface of the lower electrode; and an upper electrode line 300 disposed on the ultra-thin fin LED devices 101; wherein the plurality of disposed ultra-thin fin LED devices 101 have a drivable mounting ratio of 55% or more in which the first surface (B) or second surface (T) of each device is mounted so as to come into contact with the upper surface of the lower electrodes 211, 212, 213 and 214.

As described in the manufacturing method, each of the ultra-thin LED devices 101 input into the process is mounted so that the first surface (B) or the second surface (T) among the various surfaces of the device dominantly contacts the upper surfaces of the lower electrodes 211, 212, 213 and 214, whereby an ultra-thin fin LED electrode assembly 1000 satisfying a drivable mounting ratio of 55% or more can be implemented. In addition, preferably, the ultra-thin fin LED electrode assembly can satisfy the drivable mounting ratio of 70% or more, more preferably 75% or more, still more preferably 80% or more, 90% or more, or 95% or more, whereby excellent luminance can be achieved by minimizing the case where the input ultra-thin fin LED devices are not mounted or the side surface is mounted, and the manufacturing cost can be lowered by reducing the number of wasted ultra-thin fin LED devices. If the drivable mounting ratio is less than 55%, the manufacturing cost may greatly increase, and the luminance characteristics may be greatly deteriorated as there are many ultra-thin fin LED devices that are mounted but are not driven (emitted) and are wasted.

In addition, according to one embodiment of the present invention, the ultra-thin fin LED electrode assembly 1000 may be configured such that the selective mounting ratio, which is a ratio mounted selectively so that the mounting surface of the mounted ultra-thin fin LED devices 101 is any one of the first surface (B) and the second surface (T), satisfies 70% or more, more preferably 85% or more, even more preferably 90% or more, and even more preferably 93% or more. Thereby, it is possible to increase the driving rate and luminance of the mounted ultra-thin fin LED devices, and in particular, the range of applications that can select DC power instead of AC as the driving power source can be expanded. Further, it may be advantageous to implement increased luminance due to the use of DC power.

In addition, the ultra-thin fin LED electrode assembly 1000 may have a unit area capable of independently driving it, for example, the unit area of 1 $\mu m^2$ to 100 $cm^2$, more preferably 10 $\mu m^2$ to 100 $cm^2$, but is not limited thereto. In addition, the ultra-thin fin LED electrode assembly 1000 may include 2 to 100,000 ultra-thin fin LED devices 101 per unit area of 100×100 $\mu m^2$, but is not limited thereto.

Meanwhile, as described above, the ultra-thin fin LED device 101 provided in the ultra-thin fin LED electrode assembly 1000 may be mounted so that some of the mounted ultra-thin fin LED devices have side surfaces (S) in contact with the upper surface of the lower electrode, as long as the drivable mounting ratio does not reach 100%. In this case, if the width, which is the length in the y-axis direction, and the thickness, which is the length in the z-axis direction, of the ultra-thin fin LED device are the same, heights from the upper surface of the lower electrode to the opposite surface facing the mounting surface of the mounted ultra-thin fin LED device may all be the same when the ultra-thin fin LED electrode assembly 1000 is viewed from the side. In this case, the ultra-thin fin LED device mounted so that the side surface (S) contacts the upper surface of the lower electrode is also electrically contacted with the upper electrode, which may cause electrical leakage or electrical short circuit.

Figure 14:
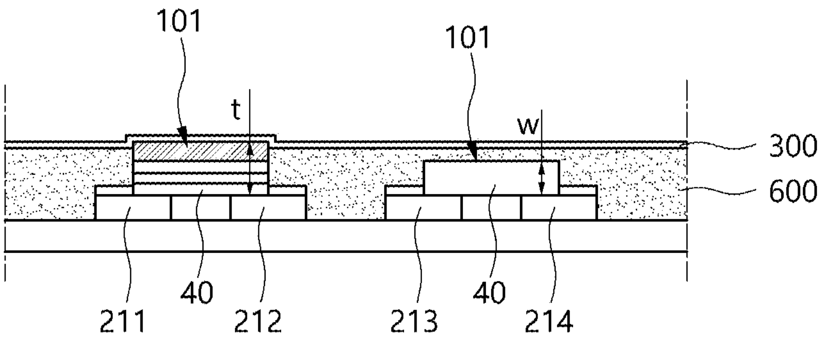
FIG. 14 is a schematic cross-sectional view of an ultra-thin fin LED electrode assembly according to an embodiment of the present invention.

Accordingly, according to one embodiment of the present invention, the width of the ultra-thin fin LED device may be smaller than the thickness, whereby it is possible to prevent electrical short circuit or leakage caused by contact of the side surface of the device with the lower electrode. Referring to FIG. 14, even when mounted so that the side surfaces are in contact as in the ultra-thin fin LED device 101 in contact with the lower electrodes 213 and 214 located on the right side of the four lower electrodes 211, 212, 213 and 214, the width (W) is smaller than the thickness (t) of the ultra-thin fin LED device (101). Therefore, the ultra-thin fin LED device whose side surface is in contact has no fear of contacting the upper electrode line 300, thereby preventing electrical short circuit or leakage that may occur due to the ultra-thin fin LED device 101 on the right side when driving power is applied.

In addition, the above-described ultra-thin fin LED electrode assembly 1000 can be applied to a known light source in which an LED device is employed. For example, referring to FIGS. 15, 16*a* and 16*b*, the light sources 2000, 2000' and 3000 according to an embodiment of the present invention may be implemented by including supports 1100, 1100' and 1100" and the ultra-thin fin LED electrode assemblies 1000, 1001, 1002 and 1003 provided on the supports 1100, 1100' and 1100".

The supports 1100, 1100' and 1100" are for supporting the ultra-thin fin LED electrode assemblies 1000, 1001, 1002 and 1003. Any support can be used without limitation regardless of the material as long as it has mechanical strength above a certain level to perform the support function. As a non-limiting example thereof, it may be one or more materials selected from the group consisting of organic resins, ceramics, metals, and inorganic resins. In addition, the supports 1100, 1100' and 1100" may be transparent or opaque.

Figure 15:
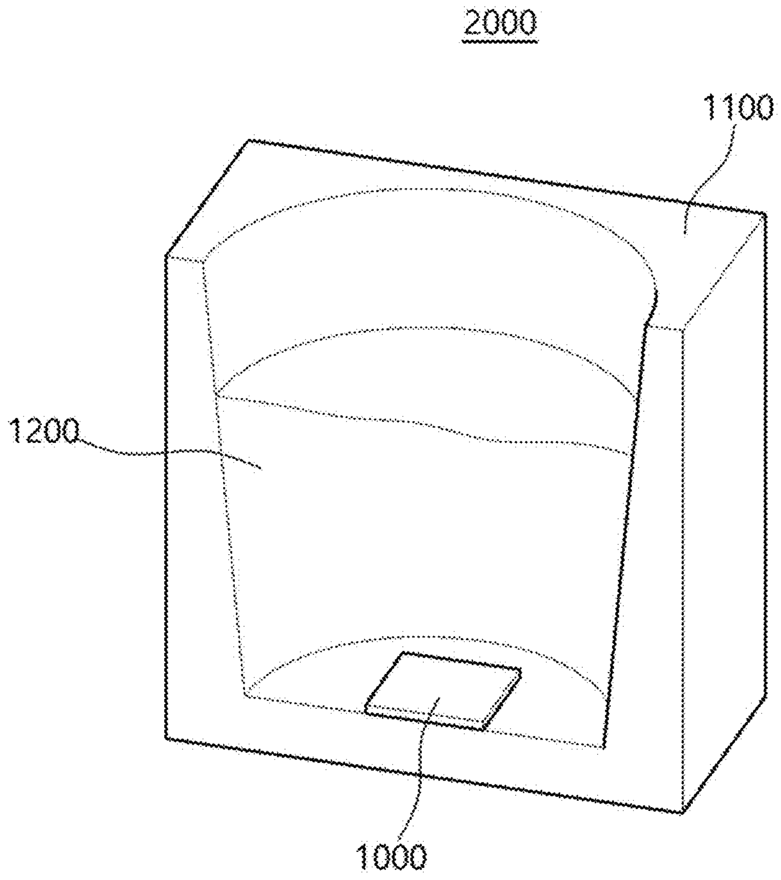
FIG. 15 is a schematic diagram of a light source according to an embodiment of the present invention.
Figure 16A:
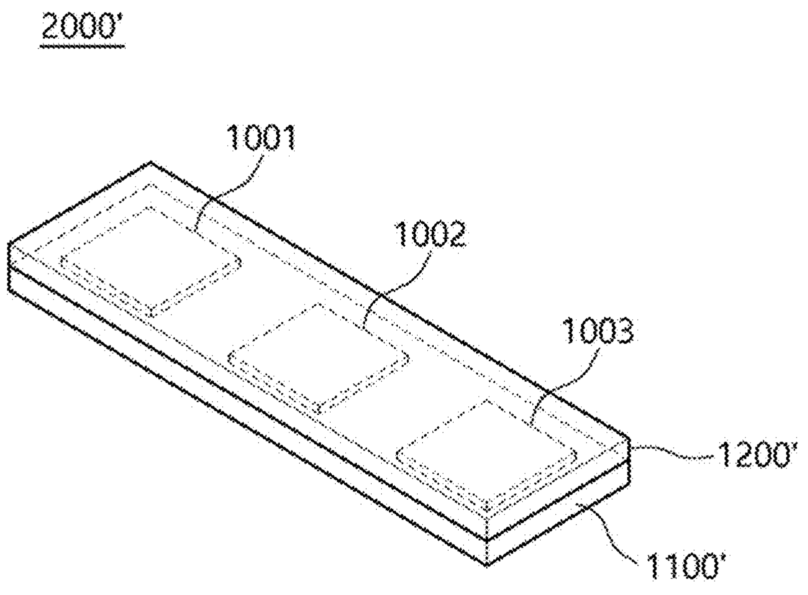
FIGS. 16A and 16B are schematic diagrams of light sources according to various embodiments of the present invention.
Figure 16B:
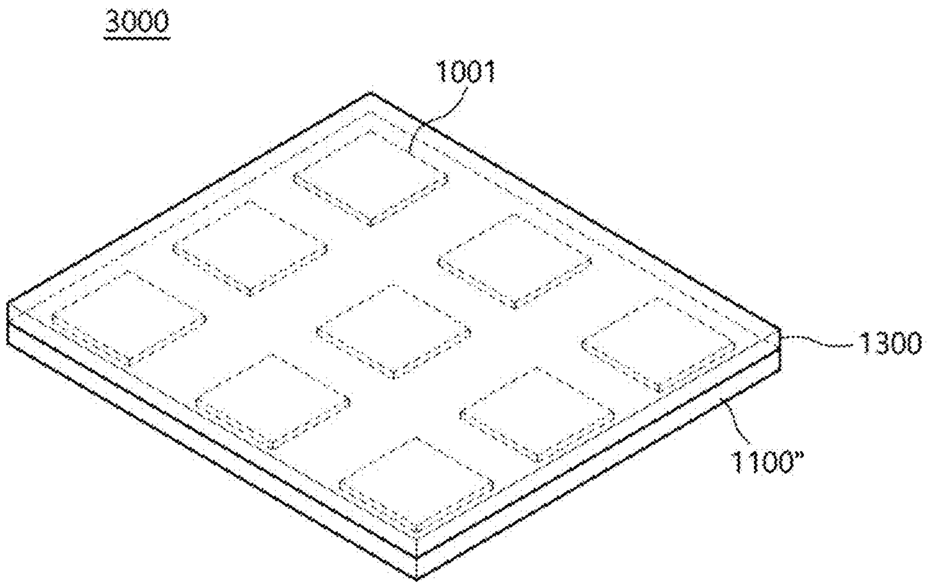

In addition, the supports 1100, 1100' and 1100" may be cup-shaped as shown in FIG. 15 or plate-shaped as shown in FIGS. 16A and 16B, but are not limited thereto, and may have various shapes depending on the shape of the surface on which the light source is mounted. In addition, the area and/or volume of the supports 1100, 1100' and 1100" may also be appropriately adjusted in consideration of the luminance characteristics of the light source to be implemented, the number/arrangement structure of the ultra-thin fin LED electrode assemblies 1000, 1001, 1002 and 1003 provided accordingly, the use of the light source, and the like, and thus, the present invention is not particularly limited in this regard. In addition, the supports 1100, 1100' and 1100" may have an appropriate thickness to support the ultra-thin fin LED electrode assemblies 1000, 1001, 1002 and 1003 in consideration of the strength of the material.

In addition, it should be noted that the support 1100 shown in FIG. 15 may serve as a housing for the light source in itself in addition to the function of supporting the ultra-thin fin LED electrode assemblies 1000, 1001, 1002 and 1003.

In addition, one or two or more ultra-thin fin LED electrode assemblies 1000, 1001, 1002 and 1003 may be provided in the light sources 2000, 2000' and 3000. In this case, the ultra-thin fin LED devices 100, 101 and 102 provided in the single ultra-thin fin LED electrode assembly 1000, 1001, 1002 and 1003 may be formed of devices that emit light of substantially any one color, wherein the light color may be, for example, any one of UV, blue, green, yellow, amber, and red. Meanwhile, when two or more ultra-thin fin LED electrode assemblies 1001, 1002 and 1003 are provided in the light sources 2000' and 3000, and they are configured to be driven independently, the light source may be implemented to emit various types of light colors, and such a light source may be employed in a display such as LCD or OLED. In addition, when two or more ultra-thin fin LED electrode assemblies 1000, 1001, 1002, and 1003 are included, they may be regularly arranged, for example, arranged linearly in any one direction as shown in FIG. 16A, or arranged in a plane as shown in FIG. 16B, or may be otherwise randomly arranged.

In addition, the light sources 2000, 2000' and 3000 may further include a color conversion material so that light emitted from the ultra-thin fin LED electrode assemblies 1000, 1001, 1002 and 1003 has a specific wavelength. The color conversion material performs a function of being excited by the light emitted from the ultra-thin fin LED devices 100, 101 and 102 to emit light having a specific wavelength. For example, as shown in FIG. 15, when the support 1100 has a cup shape and has an accommodating part therein, the color conversion material is provided in an embedding layer 1200 in the accommodating part. Alternatively, as shown in FIGS. 16A and 16B, when the supports 1100' and 1100" are plate-shaped, the color conversion material may be provided in the form of coating layers 1200' and 1300.

In addition, the ultra-thin fin LED devices 100, 101 and 102 may be devices that emit light of any one of UV, blue, green, yellow, amber and red, and the color conversion material may be determined in consideration of the light color emitted by the selected device. For example, in the case of a device emitting UV light, the color conversion material may be any one or more of blue, cyan, yellow, green, amber, and red, whereby a monochromatic light source of any one color or a white light source can be implemented. For example, in the case of a device implementing a white light source, the color conversion material may be a mixture of any one of blue/yellow, red/cyan, blue/green/red, and blue/green/amber/red, whereby a white light source can be implemented. In addition, in the case of a device emitting blue light, the color conversion material may be any one or more of yellow, cyan, green, amber and red, whereby a monochromatic light source or a white light source can be implemented. As an example of implementing the white light source, any two or more colors may be combined, and specifically, the white light source can be realized by combining any one of blue/yellow, red/cyan, blue/green/red, and blue/green/amber/red.

Meanwhile, the color conversion material may be a known phosphor or quantum dot used for lighting, display, etc., and the present invention is not particularly limited with respect to its specific type.

The above-described light sources 2000, 2000' and 3000 may constitute electrical and electronic components or devices by themselves or in combination with other known components. As an example, the known components may be an input unit for receiving signals necessary for the operation of the ultra-thin fin LED electrode assemblies 1000, 1001, 1002 and 1003, a heat dissipation unit such as a heat sink for transferring heat generated when the ultra-thin fin LED electrode assemblies 1000, 1001, 1002 and 1003 are driven to the outside, and a housing that packages the light source with other components.

In addition, the light sources 2000, 2000' and 3000 may be employed in various electric and electronic devices that require a light emitting body, such as various LED lights for home/vehicle use, displays, medical devices, beauty devices, and various optical devices. Meanwhile, the medical device may be, for example, an LED light source for optogenetics, which emits light of a predetermined wavelength to a brain to activate a neural network or the like in the corresponding region. The LED light source for optogenetics may include a plurality of ultra-thin fin LED electrode assemblies on a support. In addition, the beauty device may be, for example, an LED mask for skin care, and may be implemented to include a plurality of ultra-thin fin LED electrode assemblies on an inner surface of a mask support that comes into contact with a skin.

Hereinafter, the present invention will be described in more detail by way of the following examples, but it should be understood that the examples are not intended to limit the scope of the present invention, but to aid understanding of the present invention.

Example 1

First, an ultra-thin fin LED device was prepared as follows. Specifically, a conventional LED wafer (Epistar) was prepared in which an undoped n-type III-nitride semiconductor layer, a Si-doped n-type III-nitride semiconductor layer (thickness: 4 μm), a photoactive layer (thickness: 0.15 μm), and a p-type III-nitride semiconductor layer (thickness: 0.05 μm) are sequentially stacked on a substrate. On the prepared LED wafer, ITO (thickness: 0.15 μm) as a selective alignment-directing layer, $SiO_2$ (thickness: 1.2 μm) as a first mask layer, and Ni (thickness: 80.6 nm) as a second mask layer were sequentially deposited, and then a rectangular pattern-transferred SOG resin layer was transferred onto the second mask layer using nanoimprint equipment. Then, the SOG resin layer was cured using RIE, and the remaining resin portion of the resin layer was etched through RIE to form a resin pattern layer. Thereafter, the second mask layer was etched using ICP along the pattern, and the first mask layer was etched using RIE. Thereafter, the first electrode layer, the p-type III-nitride semiconductor layer, and the photoactive layer were etched using ICP, and then the doped n-type III-nitride semiconductor layer was etched to a thickness of 0.5 μm, and an LED wafer having a plurality of LED structures (long side 4 μm, short side 750 nm, height 850 nm) from which the mask pattern layer was removed by KOH wet etching was manufactured. Afterwards, a temporary protective film of $Al_2O_3$ was deposited on the LED wafer having the plurality of LED structures formed therein (deposition thickness of 72 nm based on the side surface of the LED structure), and then the temporary protective film material formed between the plurality of LED structures was removed through RIE to expose the top surface of the doped n-type III-nitride semiconductor layer between the LED structures.

Figure 17:
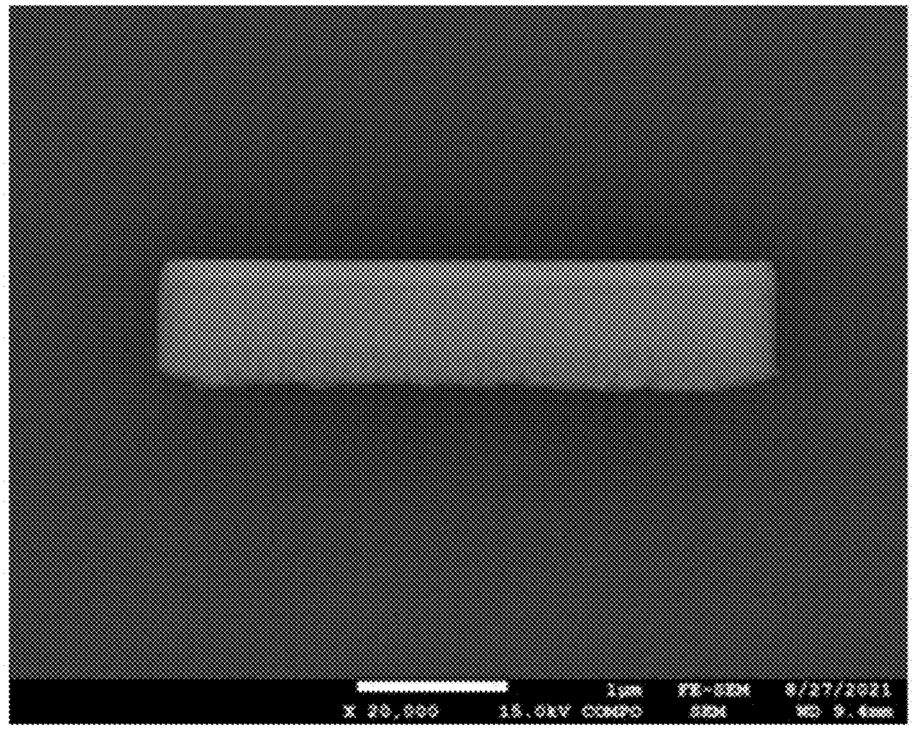
FIGS. 17 to 20 are side SEM pictures of several ultra-thin fin LED devices included in an embodiment of the present invention.

Thereafter, the LED wafer having the temporary protective film formed was immersed in an electrolyte, which is an aqueous solution of 0.3 M oxalic acid, and then connected to an anode terminal of the power supply. A cathode terminal was connected to a platinum electrode immersed in the electrolyte, and then a 15V voltage was applied for 5 minutes to form a plurality of pores in the thickness direction from the surface of the doped n-type III-nitride semiconductor layer between the LED structures. Thereafter, the temporary protective film was removed through ICP, and then a rotation induction film of $SiO_2$ was deposited with a thickness of 60 nm based on the side surface of the LED structure, wherein the rotation induction film of $SiO_2$ has a real part of the K(ω) value according to Equation 1 of 0.336 when the solvent is acetone with a dielectric constant of 20.7 and the frequency of the applied power is in the frequency band of 10 kHz to 10 GHz, assuming that the particles in Equation 1 above are spherical core-shell particles having a radius of 430 nm and composed of GaN with a radius of 400 nm as the core part and a rotational induction film with a thickness of 30 nm as the shell part. Thereafter, the rotation induction film material formed between the LED structures is removed through RIE to expose an upper surface of the doped n-type III-nitride semiconductor layer between the LED structures. Then, the LED wafer was immersed in a 100% gamma-butyrolactone bubble-forming solution, and ultrasonic waves were irradiated thereto at an intensity of 160 W and 40 kHz for 10 minutes to generate bubbles. The generated bubbles were used to collapse the pores formed in the doped n-type III-nitride semiconductor layer, thereby manufacturing a plurality of ultra-thin fin LED devices as shown in the SEM picture of FIG. 17.

Thereafter, a lower electrode line was prepared in which a first lower electrode and a second lower electrode extending in a first direction are alternately formed on a base substrate made of quartz and having a thickness of 500 μm so that the interval is 3 μm in a second direction perpendicular to the first direction. Here, the first lower electrode and the second lower electrode each have a width of 10 μm and a thickness of 0.2 μm, the material of the first lower electrode and the second lower electrode is gold, and the area of the region of the lower electrode line on which the ultra-thin fin LED device is mounted was set to 1 $mm^2$. In addition, an insulating barrier made of $SiO_2$ was formed on the base substrate to a height of 0.5 μm to surround the mounted region.

Thereafter, 120 prepared ultra-thin fin LED devices are mixed with acetone having a dielectric constant of 20.7 to prepare a solution. 9 μl of the prepared solution was dropped twice in the mounted region, and then a sine wave AC power of 10 kHz and 40 Vpp as an assembly power was applied to the first lower electrode and the second lower electrode to mount the ultra-thin fin LED device on the lower electrode through dielectrophoresis.

Thereafter, a passivation material of $SiO_2$ was deposited using the PECVD method at a height corresponding to the thickness of the ultra-thin fin LED devices in the region where the ultra-thin fin LED devices were mounted, and then extended in a second direction perpendicular to the first direction. A plurality of upper electrodes (width: 10 μm, thickness: 0.2 μm, inter-electrode spacing: 3 μm, and material: gold) spaced apart from each other in the first direction were formed on the upper surface of the mounted ultra-thin fin LED device to implement an ultra-thin fin LED electrode assembly.

Example 2

An ultra-thin fin LED device was manufactured in the same manner as in Example 1, except that the rotation induction film was changed to a rotation induction film of $SiN_x$ having a value of the real part of K(ω) according to Equation 1 of 0.501 under the same conditions, and used to implement an ultra-thin fin LED electrode assembly.

Example 3

An ultra-thin fin LED device was manufactured in the same manner as in Example 1, except that the rotation induction film was changed to a rotation induction film of $TiO_2$ having a value of the real part of K(ω) according to Equation 1 of 0.944 under the same conditions, and used to implement an ultra-thin fin LED electrode assembly.

Example 4

Figure 18:
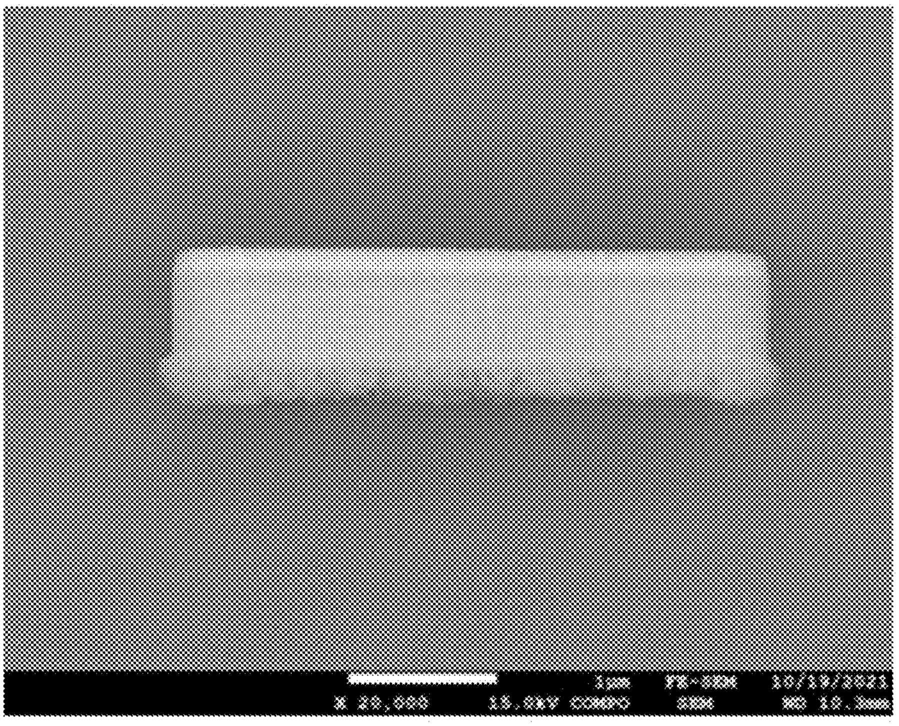

An ultra-thin fin LED device as shown in the SEM picture of FIG. 18 was manufactured in the same manner as in Example 1, except that the rotation induction film was not formed, and used to implement an ultra-thin fin LED electrode assembly.

Example 5

Figure 19:
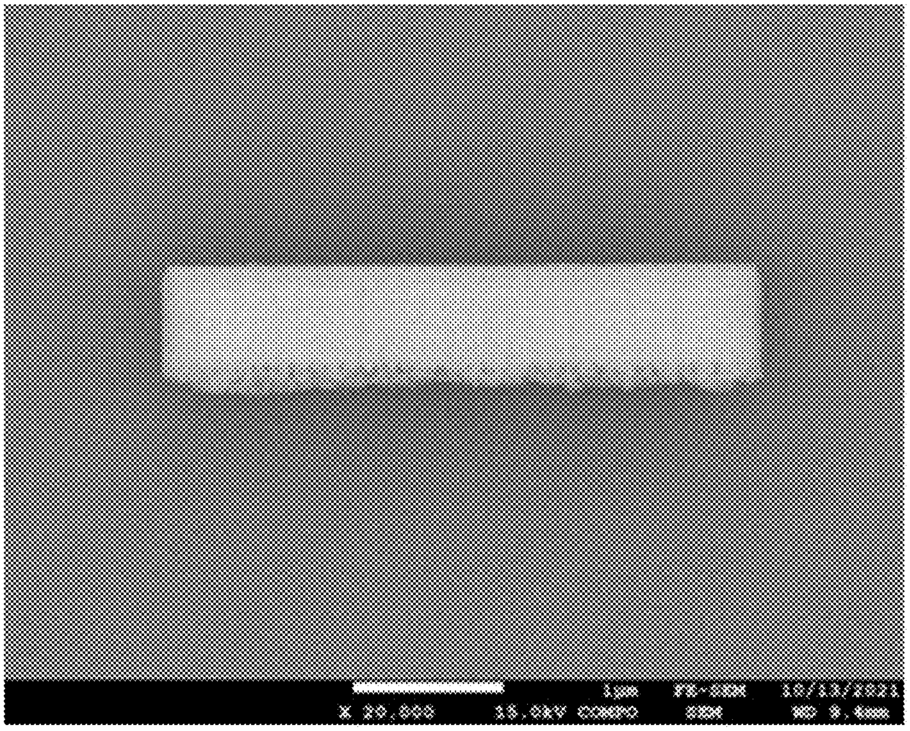

An ultra-thin fin LED device as shown in the SEM picture of FIG. 19 was manufactured in the same manner as in Example 1, except that ITO as a selective alignment-directing layer was not formed, and used to implement an ultra-thin fin LED electrode assembly.

Example 6

An ultra-thin fin LED device was manufactured in the same manner as in Example 3, except that ITO as a selective alignment-directing layer was not formed, and used to implement an ultra-thin fin LED electrode assembly.

Example 7

An ultra-thin fin LED device was manufactured in the same manner as in Example 1, except that the rotation induction film was deposited without forming a temporary protective film and a plural of pores, and then the rotation induction film material formed on the top of the LED structure was removed through etching, and the LED structure was separated from the wafer using a diamond cutter, and used to implement an ultra-thin fin LED electrode assembly.

Example 8

An ultra-thin fin LED device was manufactured in the same manner as in Example 7, except that the rotation induction film was changed to a rotation induction film of $Al_2O_3$ having a value of the real part of K(ω) according to Equation 1 of 0.616 under the same conditions, and used to implement an ultra-thin fin LED electrode assembly.

Example 9

An ultra-thin fin LED device was manufactured in the same manner as in Example 7, except that the rotation induction film was changed to a rotation induction film of $TiO_2$ having a value of the real part of K(ω) according to Equation 1 of 0.944, and used to implement an ultra-thin fin LED electrode assembly.

Example 10

An ultra-thin fin LED device was manufactured in the same manner as in Example 7, except that the rotation induction film was not formed, and used to implement an ultra-thin fin LED electrode assembly.

Example 11

An ultra-thin fin LED device was manufactured in the same manner as in Example 7, except that ITO as a selective alignment-directing layer was not formed, and used to implement an ultra-thin fin LED electrode assembly.

Example 12

Figure 20:
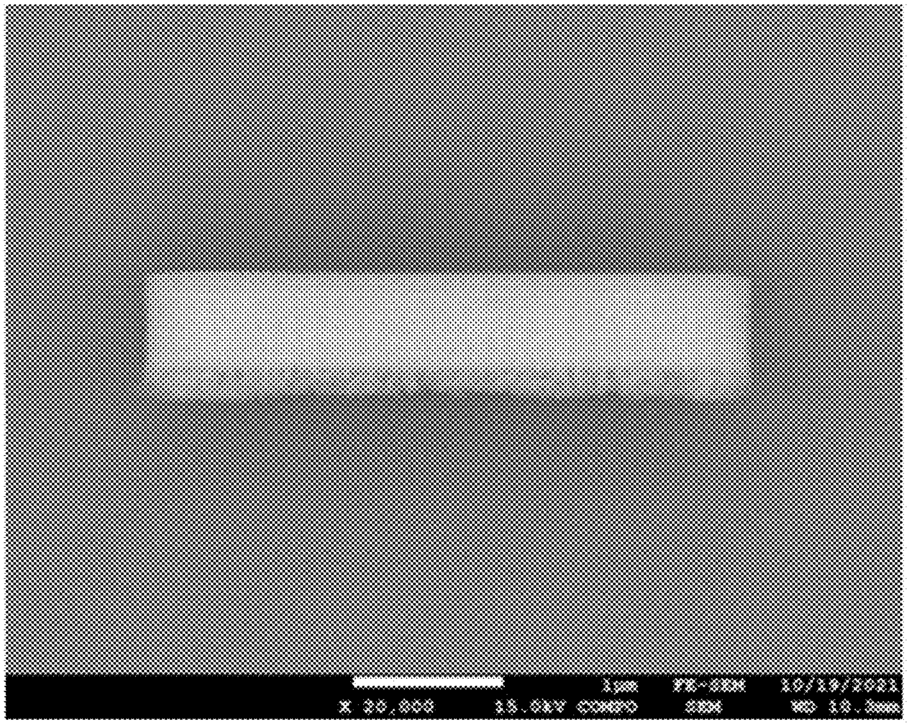
Figure 21:
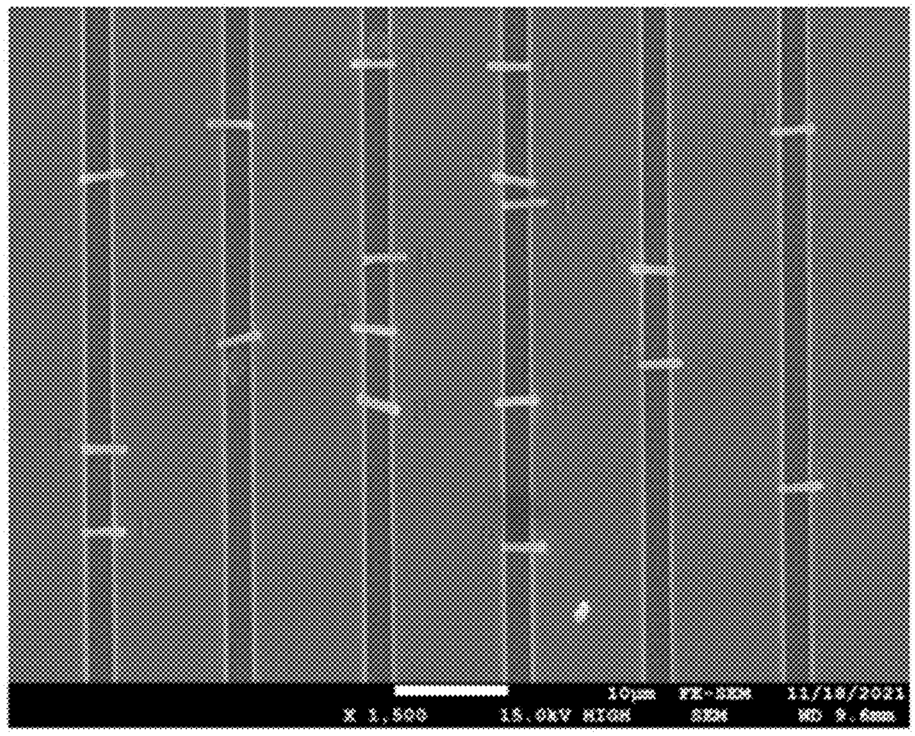
FIG. 21 is a SEM photograph of a part of an area where an ultra-thin fin LED device is mounted, taken as an experimental result of Experimental Example 1 for an ultra-thin fin LED electrode assembly according to Example 1.

An ultra-thin fin LED device as shown in the SEM picture of FIG. 20 was manufactured in the same manner as in Example 1, except that ITO as a selective alignment-directing layer and a rotation induction film were not formed, and used to implement an ultra-thin fin LED electrode assembly.

Comparative Example 1

An ultra-thin fin LED device was manufactured in the same manner as in Example 7, except that ITO as a selective alignment-directing layer and a rotation induction film was not formed, and used to prepare an ultra-thin fin LED electrode assembly.

Comparative Example 2

An ultra-thin fin LED electrode assembly was implemented in the same manner as in Example 1, except that the ultra-thin fin LED device was manufactured as follows.

Specifically, for the ultra-thin fin LED device, a conventional LED wafer (Epistar) was prepared in which an undoped n-type III-nitride semiconductor layer, a Si-doped n-type III-nitride semiconductor layer (thickness: 4 μm), a photoactive layer (thickness: 0.45 μm), and a p-type III-nitride semiconductor layer (thickness: 0.05 μm) are sequentially stacked on a substrate. On the prepared LED wafer, $SiO_2$ (thickness: 1.2 μm) as a first mask layer, and Ni (thickness: 80.6 nm) as a second mask layer were sequentially deposited, and then an SOG resin layer having a rectangular pattern transferred in the same size as in Example 1 was transferred onto the second mask layer using nanoimprint equipment. Then, the SOG resin layer was cured using RIE, and the remaining resin portion of the resin layer was etched through RIE to form a resin pattern layer. Thereafter, the second mask layer was etched using ICP along the pattern, and the first mask layer was etched using RIE. Thereafter, the first electrode layer, the p-type III-nitride semiconductor layer, and the photoactive layer were etched using ICP, and then the doped n-type III-nitride semiconductor layer was etched to a thickness of 0.6 μm, and then an LED wafer having a plurality of LED structures from which the mask pattern layer was removed by KOH wet etching was manufactured. Afterwards, $Al_2O_3$ as a temporary protective film was deposited on the LED wafer having the plurality of LED structures formed therein (deposition thickness of 72 nm based on the side surface of the LED structure), and then the temporary protective film material formed between the plurality of LED structures was removed through RIE to expose the top surface of the doped n-type III-nitride semiconductor layer between the LED structures. Thereafter, the doped n-type III-nitride semiconductor layer between the LED structures was further etched to a thickness of 0.2 μm to expose the doped n-type III-nitride semiconductor layer without the temporary protective film formed on the side surface. Then, the doped n-type III-nitride semiconductor layer exposed on the side surface of the LED structure was etched using ICP so that the doped n-type III-nitride semiconductor layer was etched in the width direction from both sides to the center. Afterwards, the temporary protective film formed on the side surface of each LED structure was removed through RIE, and a plurality of LED structures were separated by applying ultrasonic waves to the wafer. The separated LED structure was implemented to have a protrusion extending in the longitudinal direction with a predetermined width and protruding in the thickness direction on the lower surface of the doped n-type III-nitride semiconductor layer due to etching in the width direction. In this case, the ultra-thin fin LED device was manufactured so that the height from the p-type III-nitride semiconductor layer to the protrusion, and the length and width of the device were identical to those of the ultra-thin device in Example 1.

Experimental Example 1

For the ultra-thin fin LED electrode assemblies according to Examples 1 to 12 and Comparative Examples 1 to 2, the mounting surface of the ultra-thin fin LED device was evaluated as follows, and the results are shown in Table 2 below.

Specifically, SEM pictures were taken in a state in which the ultra-thin fin LED device was self-aligned after applying an assembly voltage during the manufacturing process of the ultra-thin fin LED electrode assembly, and the mounting surface of each of the ultra-thin fin LED devices in contact with the upper surface of the lower electrode on the above region was observed and counted. The results are shown in Table 2 below as a percentage of the number of ultra-thin fin LED devices input.

In addition, Table 2 also shows the drivable mounting ratio in which the mounting surface of the ultra-thin fin LED device is the first surface (B) or the second surface (T), and the selective mounting ratio in which a specific one of the first surface (B) and the second surface (T) becomes the mounting surface for each example or comparative example.

TABLE 2

| | Ultra-thin fin LED device | | | Mounting surface of ultra-thin fin LED device | | | | Mounting ratio | |
|---|---|---|---|---|---|---|---|---|---|
| | First surface (B) | Second surface (T) | Rotation induction film (K(ω)) | Second surface (T) | Side surface | First surface (B) | Total | Drivable mounting | Selective mounting (ratio/surface) |
| Example 1 | Pore/N | Selective alignment- | $SiO_2$/ 0.336 | 94% | 6% | 0% | 100% | 94% | 94%/Second surface |
| Example 2 | Pore/N | directing layer | $SiN_x$/ 0.501 | 94% | 4% | 2% | 100% | 96% | 94%/Second surface |
| Example 3 | Pore/N | (ITO) | $TiO_2$/ 0.944 | 54% | 25% | 21% | 100% | 75% | 54%/Second surface |
| Example 4 | Pore/N | | None | 88% | 7% | 5% | 100% | 93% | 88%/Second surface |

TABLE 2-continued

| | Ultra-thin fin LED device | | | Mounting surface of ultra-thin fin LED device | | | | Mounting ratio | |
|---|---|---|---|---|---|---|---|---|---|
| | First surface (B) | Second surface (T) | Rotation induction film (K(ω)) | Second surface (T) | Side surface | First surface (B) | Total | Drivable mounting | Selective mounting (ratio/ surface) |
| Example 5 | Pore/N | P | $SiO_2$/ 0.336 | 12% | 17% | 71% | 100% | 83% | 71%/First surface |
| Example 6 | Pore/N | P | $TiO_2$/ 0.944 | 14% | 30% | 56% | 100% | 70% | 56%/First surface |
| Example 7 | Non-pore/N | Selective alignment-directing layer (ITO) | $SiO_2$/ 0.336 | 93% | 6% | 1% | 100% | 94% | 93%/Second surface |
| Example 8 | Non-pore/N | | $Al_2O_3$/ 0.616 | 88% | 12% | 0% | 100% | 88% | 88%/Second surface |
| Example 9 | Non-pore/N | | $TiO_2$/ 0.944 | 53% | 25% | 22% | 100% | 75% | 53%/Second surface |
| Example 10 | Non-pore/N | | None | 87% | 9% | 4% | 100% | 91% | 87%/Second surface |
| Example 11 | Non-pore/N | P | $SiO_2$/ 0.336 | 11% | 17% | 72% | 100% | 83% | 72%/First surface |
| Example 12 | Pore/N | P | None | 11% | 44% | 45% | 100% | 56% | 45%/First surface |
| Comparative Example 1 | Non-pore/N | P | None | 3% | 52% | 45% | 100% | 48% | —/Side surface |
| Comparative Example 2 | Protruded structure/ N | P | None | 7% | 57% | 36% | 100% | 43% | —/Side surface |

※ In Table 2, N refers to an n-type III-nitride semiconductor layer, and P refers to a p-type III-nitride semiconductor layer.

As can be seen from Table 2, in the ultra-thin fin LED devices used in the ultra-thin fin LED electrode assembly according to Comparative Examples 1 and 2, the ratio of drivably mounted devices among all the ultra-thin fin LED devices input is less than 50%, and thus, the ratio of the first surface (B) or the second surface (T) in contact with the upper surface of the lower electrode is small, whereby the luminance of the ultra-thin fin LED electrode assembly is expected to be low. In contrast, in the case of the ultra-thin fin LED electrode assembly using the ultra-thin fin LED device according to the examples, the ratio of drivably mounted devices among all the ultra-thin fin LED devices input is 56% or more, and thus, the first surface (B) or the second surface (T) dominantly contacts the upper surface of the mounting electrode, whereby it can be expected that the luminance is significantly improved.

Examples 13 to 15

Ultra-thin fin LED electrode assemblies were manufactured in the same manner as in Examples 1 to 3, respectively, except that the assembly power was changed to 10 kHz and 20 Vpp conditions.

Experimental Example 2

SEM pictures were taken in a state in which the ultra-thin fin LED device was self-aligned after applying an assembly voltage during the manufacturing process of the ultra-thin fin LED electrode assembly according to Examples 13 to 15, and the mounting form of the ultra-thin fin LED devices in contact with the upper surface of the lower electrode was analyzed based on FIG. 13. The results are shown in Table 3 below.

TABLE 3

| | Ultra-thin fin LED device | | | Mounting ratio (%) | | Mounting form of drivable mounting (%) | | |
|---|---|---|---|---|---|---|---|---|
| | First surface (B) | Second surface (T) | Rotation induction film (K(ω)) | Drivable mounting | Side surface mounting | Equal both ends mounting | Biased both ends mounting | One end mounting |
| Example 13 | Pore/N | Selective alignment directing layer (ITO) | $SiO_2$/ 0.336 | 99 | 1 | 46 | 52 | 1 |
| Example 14 | Pore/N | | $SiN_x$/ 0.501 | 99 | 1 | 37 | 61 | 1 |
| Example 15 | Pore/N | | $TiO_2$/ 0.944 | 88 | 12 | 36 | 41 | 11 |

As can be seen from Table 3, in the case of the ultra-thin fin LED electrode assembly of Examples 13 and 14 employing an ultra-thin fin LED device including the rotation induction film having a real value of K(ω) of 0.6 or less, the ratio of mounting in a form in which both ends are mounted on two adjacent mounting electrodes is significantly higher than that of Example 15. Therefore, it can be expected that examples 13 and 14 have a more advantageous mounting form compared to example 15 in forming the driving electrode on the top of the ultra-thin fin LED device.

Examples 16 to 17

Ultra-thin fin LED electrode assemblies were manufactured in the same manner as in Example 1, except that the frequency and voltage of the assembly power were changed as shown in Table 4 below.

Experimental Example 3

For the ultra-thin fin LED electrode assemblies according to Examples 1, 13 and 16 to 17, the mounting surface was analyzed in the same manner as in Experimental Example 1, and the results are shown in Table 4 below.

TABLE 4

| | Assembly power | | Mounting surface of ultra-thin fin LED device | | | | Mounting ratio | |
|---|---|---|---|---|---|---|---|---|
| | Frequency (kHz) | Voltage (Vpp) | Second surface (T) | Side surface | First surface (B) | Total | Drivable mounting | Selective mounting (ratio/surface) |
| Example 1 | 10 | 40 | 94% | 6% | — | 100% | 94% | 94%/Second surface |
| Example 16 | 10 | 30 | 94% | 5% | 1% | 100% | 95% | 94%/Second surface |
| Example 13 | 10 | 20 | 98% | 1% | 1% | 100% | 99% | 98%/Second surface |
| Example 17 | 100 | 20 | 92% | 6% | 2% | 100% | 98% | 92%/Second surface |

As can be seen through Table 4, in the ultra-thin fin LED electrode assembly according to the examples, each of the ultra-thin fin LED devices is mounted such that the first or second surface thereof contacts the upper surface of the lower electrode more dominantly than the side surface under an electric field formed through the applied assembly power. Therefore, it can be expected that the driving efficiency is high and thus, the luminous efficiency is excellent. In addition, the ultra-thin fin LED devices in the ultra-thin fin LED electrode assembly according to Example 1 have a very excellent selective mounting ratio of 92% or more in which the second surface becomes the mounting surface. Therefore, it can be expected that the driving through a DC power source is possible and high luminance can be expressed.

Although an embodiment of the present invention have been described above, the spirit of the present invention is not limited to the embodiment presented in the subject specification; and those skilled in the art who understands the spirit of the present invention will be able to easily suggest other embodiments through addition, changes, elimination, and the like of elements without departing from the scope of the same spirit, and such other embodiments will also fall within the scope of the present invention.

What is claimed is:

1. An ultra-thin fin LED electrode assembly including:

a lower electrode line comprising a plurality of lower electrodes spaced apart at predetermined intervals;

a plurality of ultra-thin fin LED devices comprising, based on mutually perpendicular x-axis, y-axis and z-axis wherein the x-axis direction is a major axis and a plurality of layers are stacked in the z-axis direction, a first surface and a second surface opposite to each other in the z-axis direction, and other side surfaces, the ultra-thin fin LED devices being disposed such that one surface thereof is in contact with the upper surface of the lower electrode; and an upper electrode line disposed on the ultra-thin fin LED devices;

wherein the plurality of ultra-thin fin LED devices disposed have a drivable mounting ratio of 55% or more in which the first or second surface of each device is mounted so as to come into contact with the upper surface of the lower electrode.

2. The ultra-thin fin LED electrode assembly according to claim 1, wherein the ultra-thin fin LED device has a length of 1 to 10 μm in the x-axis direction and a thickness of 0.1 to 3 μm in the z-axis direction.

3. The ultra-thin fin LED electrode assembly according to claim 1, wherein the width of the ultra-thin fin LED device, which is the length in the y-axis direction, is smaller than the thickness, which is the length in the z-axis direction.

4. The ultra-thin fin LED electrode assembly according to claim 1, wherein the drivable mounting ratio of the plurality of ultra-thin fin LED devices disposed is 70% or more.

5. The ultra-thin fin LED electrode assembly according to claim 1, wherein a selective mounting ratio, which is a ratio of devices mounted such that one of the first and second surfaces thereof is in contact with the upper surface of the lower electrode among the plurality of ultra-thin fin LED devices disposed, satisfies 70% or more.

6. The ultra-thin fin LED electrode assembly according to claim 5, wherein the selective mounting ratio satisfies 85% or more.

7. A light source comprising:

a support, and the ultra-thin fin LED electrode assembly according to claim 1 provided such that a lower electrode line is disposed on the support.

8. The light source according to claim 7, further comprising: a color conversion material excited by light irradiated from the ultra-thin fin LED electrode assembly.

9. The light source according to claim 7, wherein the ultra-thin fin LED device provided in the ultra-thin fin LED electrode assembly is a device emitting light of any one of UV, blue, green, yellow, amber, and red.

* * * * *